United States Patent
Kawanaka et al.

(10) Patent No.: US 10,343,524 B2
(45) Date of Patent: Jul. 9, 2019

(54) WELD DETECTION APPARATUS AND WELD DETECTION METHOD

(71) Applicant: FUJITSU TEN LIMITED, Kobe-shi, Hyogo (JP)

(72) Inventors: Shota Kawanaka, Kobe (JP); Sho Tamura, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 380 days.

(21) Appl. No.: 15/416,811

(22) Filed: Jan. 26, 2017

(65) Prior Publication Data

US 2017/0225572 A1    Aug. 10, 2017

(30) Foreign Application Priority Data

Feb. 5, 2016 (JP) ................. 2016-021043

(51) Int. Cl.
| | | |
|---|---|---|
| *G01R 31/00* | (2006.01) | |
| *G01R 31/02* | (2006.01) | |
| *B60L 3/00* | (2019.01) | |
| *G01R 31/327* | (2006.01) | |

(52) U.S. Cl.
CPC .......... *B60L 3/0069* (2013.01); *G01R 31/327* (2013.01); *G01R 31/3275* (2013.01); *G01R 31/3277* (2013.01); *G01R 31/3278* (2013.01); *B60Y 2200/92* (2013.01); *G01R 31/007* (2013.01); *Y10S 903/903* (2013.01)

(58) Field of Classification Search
CPC .............. G01R 31/327; G01R 31/3278; G01R 31/3275; G01R 31/3277; G01R 31/3274; G01R 31/40

USPC .................................................. 324/415–424
See application file for complete search history.

(56) References Cited

U.S. PATENT DOCUMENTS

| | | | |
|---|---|---|---|
| 2006/0071618 A1* | 4/2006 | Yudahira | B60L 3/0023 318/12 |
| 2011/0084704 A1* | 4/2011 | Myoen | B60L 3/12 324/538 |
| 2017/0160333 A1* | 6/2017 | Kawanaka | G01R 27/025 |

FOREIGN PATENT DOCUMENTS

| | | |
|---|---|---|
| JP | 2006-136161 A | 5/2006 |
| JP | 2011-166950 A | 8/2011 |
| JP | 2012-202723 A | 10/2012 |
| JP | 2013-169087 A | 8/2013 |
| JP | 2015-050894 A | 3/2015 |

* cited by examiner

*Primary Examiner* — Giovanni Astacio-Oquendo
*Assistant Examiner* — Raul J Rios Russo
(74) *Attorney, Agent, or Firm* — Oliff PLC

(57) ABSTRACT

A weld detection apparatus is mounted on a vehicle and measures first and second voltages of a first capacitor. The first voltage is measured when the first capacitor is charged while connected in series to a power supply and a ground of a vehicle body while switches that connect the power supply to a load circuit are controlled to be in a first state. The second voltage is measured at a predetermined timing, when the first capacitor is charged while connected in series to the power supply and the ground of the vehicle body while the switches are controlled to be in a second state different from the first state. The apparatus performs a weld detection process to decide which of the switches is welded in an ON-state when a difference between the first and second voltages is equal to or smaller than a predetermined threshold value.

8 Claims, 11 Drawing Sheets

WELD DETECTION APPARATUS AND WELD DETECTION METHOD

BACKGROUND OF THE INVENTION

Field of the Invention

The invention relates to a weld detection apparatus and weld detection method.

Description of the Background Art

Vehicles such as hybrid vehicles and electric vehicles that have been widespread these days include a power supply that supplies power to a motor and the like that is a power source. The power supply includes an assembled battery made by a plurality of stacked power storage cells. After a voltage output from the power supply is boosted by a voltage boosting circuit connected to the power supply via a switch, such as a system main relay (SMR), the power is supplied to the motor at the voltage.

For example, there is a technology that prevents overcharge of the power supply by redundancy monitoring that monitors a function monitoring overcharge of the power supply based on a voltage used to charge a capacitor connected in series with the power supply in such a configuration. Moreover, for example, a technology that detects an insulation problem and a SMR weld problem of a vehicle based on the voltage used to charge a flying capacitor connected to the power supply, vehicle insulation resistance and a vehicle body earth, has been proposed.

More specifically, since in a case where the SMR is welded, the flying capacitor is charged via a vehicle insulation resistance located further than the SMR from the power supply, whether the SMR is welded can be detected by a process using the insulation problem detection. On the other hand, since, in a case where the SMR is not welded and is normal, an insulation resistance on a side of the power supply is much greater than a vehicle insulation resistance located further than the SMR, the flying capacitor is not charged. Thus, it is possible to detect, based on the voltage of the charged flying capacitor, whether or not the SMR is weld.

However, the foregoing conventional technology cannot eliminate an influence of a smoothing capacitor and the like included in the boosting circuit on charging the flying capacitor. Thus, difference occurs in weld detection for a SMR, i.e., it is not possible to accurately perform the weld detection for the SMR.

SUMMARY OF THE INVENTION

According one aspect of the invention, a weld detection apparatus that is mounted on a vehicle includes a microcomputer configured to: measure a first voltage of a first capacitor and measure a second voltage of the first capacitor, the first voltage being measured when the first capacitor is charged while connected in series to a power supply and a ground of a vehicle body of the vehicle while switches that connect the power supply to a load circuit are controlled to be in a first state, the second voltage being measured at a predetermined timing, when the first capacitor is charged while connected in series to the power supply and the ground of the vehicle body of the vehicle while the switches are controlled to be in a second state different from the first state; and perform a weld detection process to decide which of the switches is welded in an ON-state in a case where a difference between the first voltage and the second voltage is equal to or smaller than a predetermined threshold value, and determine that none of the switches is welded in the ON-state in a case where the difference between the first voltage and the second voltage is greater than the predetermined threshold value.

Thus, the weld detection for the SMRs can be performed accurately.

According another aspect of the invention, a second capacitor is included in the load circuit, and the predetermined timing is a time point at which a measurement accepting signal is sent from an external apparatus that monitors a voltage of the second capacitor, once the voltage of the second capacitor satisfies a predetermined condition. The external apparatus is external to the microcomputer and external to the load circuit.

Thus, the weld detection for the SMRs can be completed speedily.

Therefore, an object of this invention is to provide a weld detection apparatus and a weld detection method for accurately performing weld detection for SMRs.

These and other objects, features, aspects and advantages of the invention will become more apparent from the following detailed description of the invention when taken in conjunction with the accompanying drawings.

DESCRIPTION OF THE EMBODIMENTS

An example of embodiments of a weld detection apparatus and a weld detection method of this application will be described below with reference to the drawings. In the embodiment below, a configuration and a process relating to a technology disclosed below will be mainly described and other configurations and processes will be omitted. Moreover, the embodiment described below is not intended to limit the disclosed technology. Further, each of the embodiments and modifications may be combined with one another arbitrarily if a combination does not cause contradiction. In the embodiments, same numerical references are given to same elements or same steps, and explanation of the elements and the steps, if described earlier, will be omitted.

Embodiment 1

(Vehicle-Mounted System of a First Embodiment)

Figure 1:
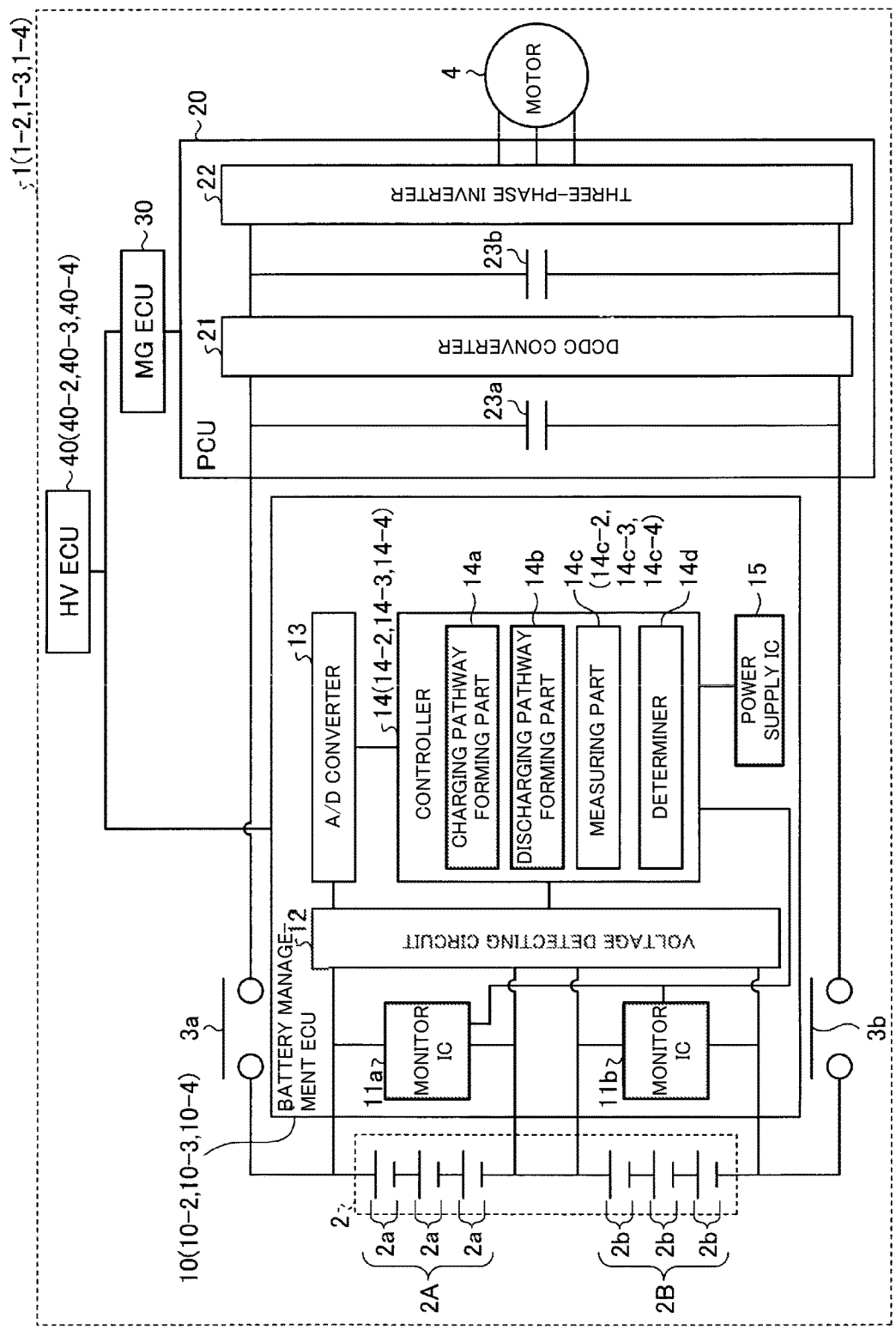
FIG. 1 illustrates an example of a vehicle-mounted system of a first embodiment.

FIG. 1 illustrates an example of a vehicle-mounted system of a first embodiment. A vehicle-mounted system 1 is mounted on a vehicle, such as a hybrid electric vehicle (HEV), an electric vehicle (EV) and a fuel cell vehicle (FCV). The vehicle-mounted system 1 performs control including charging and discharging of a power supply that supplies power to a motor that is a power source of the vehicle.

The vehicle-mounted system 1 includes an assembled battery 2, a SMR (system main relay) 3a, a SMR 3b, a motor 4, a battery management ECU 10, a PCU 20, a MG ECU (motor generator ECU) 30 and an HV ECU (hybrid ECU) 40. Electronic devices, such as the motor 4, the PCU 20 and the MG ECU 30, are examples of a load circuit. The term PCU is an abbreviation of power control unit, and the term ECU is an abbreviation of electric control unit.

The assembled battery 2 is the power supply (battery) insulated from a vehicle body, not illustrated, and is configured so as to include a plurality, for example, two, of battery cell stacks 2A and 2B connected in series. The battery cell stacks 2A and 2B include a plurality, for example, three, of battery cells 2a and of battery cells 2b, respectively. In other words, the assembled battery 2 is a high voltage DC power supply.

A number of the battery cell stacks and a number of the battery cells are not limited to the aforementioned or an illustration in the drawings. Moreover, a lithium ion secondary battery, a nickel hydride secondary battery and the like can be used for the battery cell. However, the battery cell is not limited to those batteries.

The SMR 3a is controlled by the HV ECU 40 to be turned ON and OFF. While being ON, the SMR 3a connects the PCU 20 to a highest voltage side of the assembled battery 2. The SMR 3b is controlled by HV ECU 4 to be turned ON and OFF, and while being ON, the SMR 3b connects the PCU 20 to a lowest voltage side of the assembled battery 2. The SMRs 3a and 3b are controlled by the HV ECU 40 to be simultaneously turned ON or OFF.

(Battery Management ECU of the First Embodiment)

The battery management ECU 10 is an electronic control apparatus that monitors a state of the assembled battery 2 and that controls the assembled battery 2. The battery management ECU 10 includes a monitor IC (integrated circuit) 11a, a monitor IC 11b, a voltage detecting circuit 12, an A/D (analog/digital) converter 13, a controller 14 and a power supply IC 15. The power supply IC 15 supplies power to the monitor IC 11a, the monitor IC 11b, the voltage detecting circuit 12, the A/D converter 13 and the controller 14.

The monitor IC 11a is connected to each of the plurality of the battery cells 2a so as to monitor a voltage of each battery cell 2a. Moreover, the monitor IC 11a is connected to a highest voltage side and a lowest voltage side of the battery cell stack 2A so as to monitor a voltage of the battery cell stack 2A. The monitor IC 11b is connected to each of the plurality of the battery cells 2b so as to monitor a voltage of each battery cell 2b. Moreover, the monitor IC 11b is connected to a highest voltage side and a lowest voltage side of the battery cell stack 2B so as to monitor a voltage of the battery cell stack 2B. One monitor IC may be provided to each of the battery cells, or one monitor IC may be provided to the assembled battery 2.

(Voltage Detecting Circuit)

Figure 2:
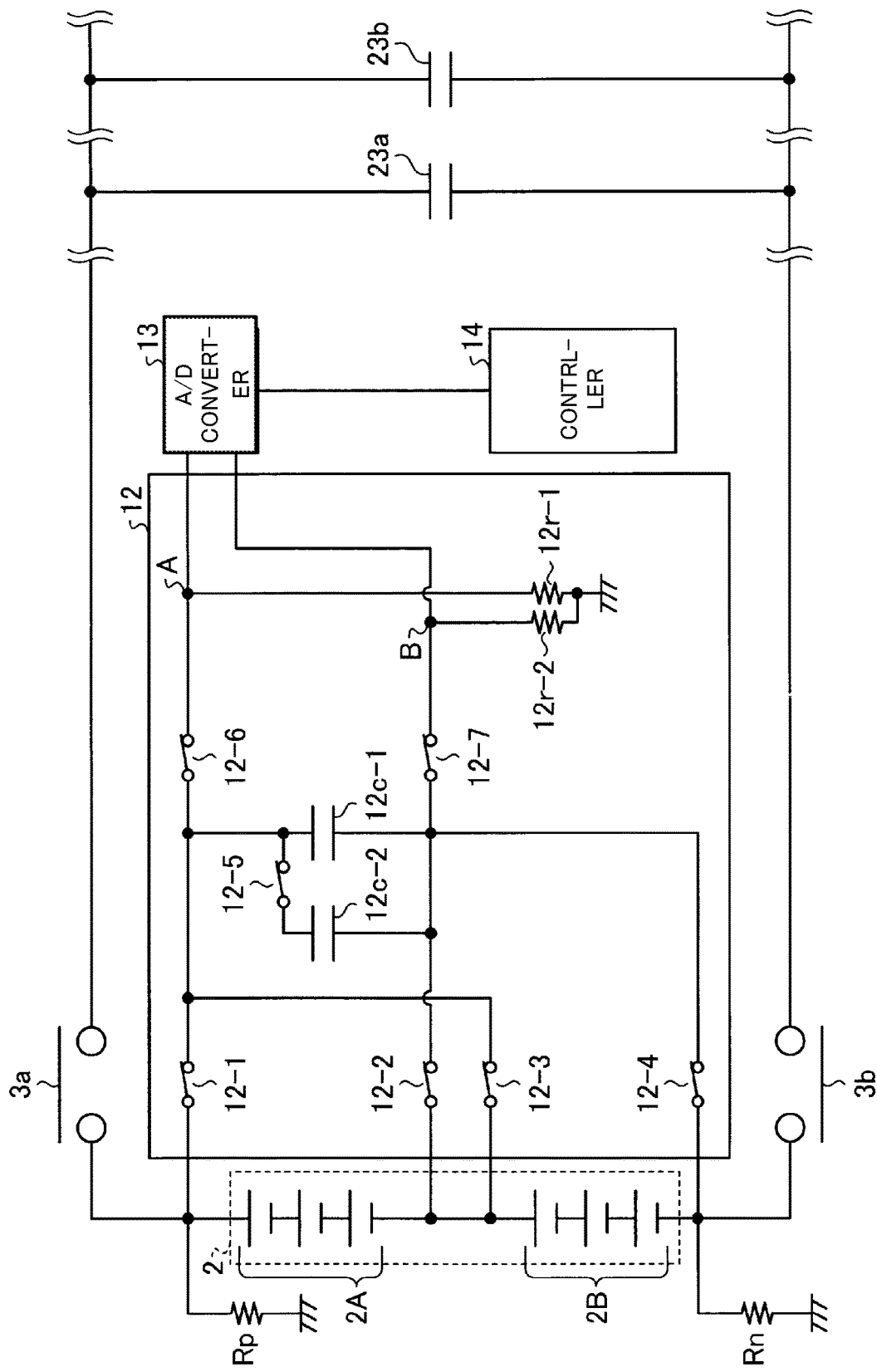
FIG. 2 illustrates an example of a voltage detecting circuit of the first embodiment.

FIG. 2 illustrates an example of a voltage detecting circuit of the first embodiment. FIG. 2 is only an example of the voltage detecting circuit, and other circuit configurations having a similar function may be used. As illustrated in FIG. 2, the voltage detecting circuit 12 includes a first switch 12-1 to a seventh switch 12-7, a capacitor 12c-1, a capacitor 12c-2, a resistor 12r-1 and a resistor 12r-2. Solid state relays (SSR) may be used as the first switch 12-1 to the seventh switch 12-7. However, the switch is not limited to the solid state relay.

Here, the capacitor 12c-1 and the capacitor 12c-2 are used as flying capacitors. When the fifth switch 12-5 is turned ON, the capacitor 12c-1 and the capacitor 12c-2 are connected in parallel so as to function as the flying capacitors. Moreover, when the fifth switch 12-5 is turned OFF, the capacitor 12c-2 is excluded from the voltage detecting circuit 12 and thus only the capacitor 12c-1 functions as the flying capacitor.

Whether both of the capacitors 12c-1 and 12c-2 are used as the flying capacitors or only the capacitor 12c-1 is used as the flying capacitor can be changed appropriately, depending on an object to be measured based on a voltage of a charged flying capacitor. For example, in a case where only the capacitor 12c-1 is used as the flying capacitor, a charging time period is relatively short because capacitance of the flying capacitor is relatively small. The description below explains a case in which the fifth switch 12-5 is turned OFF so that only the capacitor 12c-1 functions as the flying capacitor. However, the case is not limited to this but a same is true in a case in which the fifth switch 12-5 is turned ON so that the capacitors 12c-1 and 12c-2 both function as the flying capacitors.

In the voltage detecting circuit 12, the capacitor 12c-1 is charged in order by the voltage of the battery cell stack 2A, the voltage of the battery cell stack 2B and a total voltage of the assembled battery 2. Then, in the voltage detecting circuit 12, the voltages of the charged capacitor 12c-1 are detected as the voltage of the battery cell stack 2A, the voltage of the battery cell stack 2B and the total voltage of the assembled battery 2.

More specifically, the voltage detecting circuit 12 is divided by the capacitor 12c-1 into a charging pathway and a discharging pathway. In the charging pathway, the capacitor 12c-1 is connected in parallel to each of the battery cell stack 2A and the battery cell stack 2B of the assembled battery 2 and the assembled battery 2 itself, and the charging pathway includes a pathway to charge the capacitor 12c-1 by each of the voltage of the battery cell stack 2A, the voltage of the battery cell stack 2B and the total voltage of the assembled battery 2. Moreover, discharging pathway includes a pathway to discharge the charged capacitor 12c-2.

Since the first switch 12-1 to a fourth switch 12-4 and a sixth switch 12-6 to the seventh switch 12-7 are controlled to be turned ON and OFF, charging and discharging of the capacitor 12c-1 are controlled.

In the charging pathway of the voltage detecting circuit 12, the first switch 12-1 is provided in series between a positive electrode side of the battery cell stack 2A and the capacitor 12c-1, and the second switch 12-2 is provided in series between a negative electrode side of the battery cell stack 2A and the capacitor 12c-1.

Moreover, in the charging pathway of the voltage detecting circuit 12, a third switch 12-3 is provided in series between a positive electrode side of the battery cell stack 2B and the capacitor 12c-1, and the fourth switch 12-4 is provided in series between a negative electrode side of the battery cell stack 2B and the capacitor 12c-1.

In the discharging pathway of the voltage detecting circuit 12, the sixth switch 12-6 is provided on the positive electrode side of the battery cell stacks 2A and 2B, and one end of the sixth switch 12-6 is connected to the capacitor 12c-1. The seventh switch 12-7 is provided on the negative electrode side of the battery cell stacks 2A and 2B, and one end of the seventh switch 12-7 is connected to the capacitor 12c-1.

Another end of the sixth switch 12-6 is connected to the A/D converter 13 and branches at a branch point A to be connected to a ground of the vehicle body of the vehicle via the first resistor 12r-1. Moreover, another end of the seventh switch 12-7 is connected to the A/D converter 13 and branches at a branch point B to be connected to the ground of the vehicle body of the vehicle via the second resistor 12r-2. The ground of the vehicle body is an example of a ground, and a voltage at the ground is hereinafter referred to as "body voltage."

The A/D converter 13 convers an analog value indicative of a voltage at the branch point A of the voltage detecting circuit 12 into a digital value, and then outputs the converted digital value to the controller 14.

Next described will be the charging and the discharging of the capacitor 12c-1 to detect the voltages of the battery cell stacks 2A and 2B and the assembled battery 2, which is so-called redundant stack monitoring. A case where the fifth switch 12-5 is turned ON and the capacitor 12c-1 and the capacitor 12c-2 are connected in parallel is the same. Moreover, in the embodiments, the term "stack" includes a block that is an aggregation of stacks. Thus, a voltage of the battery cell stack includes a voltage of a battery cell block.

The capacitor 12c-1 is charged by each of the battery cell stack 2A, the battery cell stack 2B and the assembled battery 2 in the voltage detecting circuit 12. In the description below, the term "stack measurement" means a process in which the capacitor 12c-1 is charged by each of the voltages of the battery cell stacks 2A and 2B, and then in which each voltage of the battery cell stacks 2A and 2B is measured based on a voltage of the charged capacitor 12c-1. Moreover, the stack measurement may include a process in which the capacitor 12c-1 is charged by the total voltage of the assembled battery 2 and then in which the total voltage of the assembled battery 2 is measured based on the voltage of the charged capacitor 12c-1. State monitoring, including charging and discharging of the battery cell stacks 2A and 2B and the assembled battery 2, performed in the stack measurement is referred to as "redundant stack monitoring."

In a case where the capacitor 12c-1 is charged by the voltage of the battery cell stack 2A, the first switch 12-1 and the second switch 12-2 are turned on in FIG. 2, and the third switch 12-3 to the fourth switch 12-4 and the sixth switch 12-6 to the seventh switch 12-7 are turned OFF. Thus, a pathway (first pathway) is formed, including the battery cell stack 2A and the capacitor 12c-1, and thus the capacitor 12c-1 is charged by the voltage of the battery cell stack 2A.

After a predetermined time period has passed since the first pathway has been formed, the capacitor 12c-1 is discharged. More specifically, the first switch 12-1 and the second switch 12-2 are turned OFF, and the sixth switch 12-6 and the seventh switch 12-7 are turned ON. Thus, a pathway ("second pathway") including the capacitor 12c-1, the first resistor 12r-1 and the second resistor 12r-2 is formed, and then the capacitor 12c-1 is discharged.

Since another end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned ON, into a digital value, and then outputs the converted value to the controller 14. Thus, the voltage of the battery cell stack 2A is detected.

In a case where the capacitor 12c-1 is charged by the voltage of the battery cell stack 2B, the third switch 12-3 and the fourth switch 12-4 are turned ON in FIG. 2, and the first switch 12-1 to the second switch 12-2 and the sixth switch 12-6 to the seventh switch 12-7 are turned OFF. Thus, a pathway (third pathway) is formed, including the battery cell stack 2B and the capacitor 12c-1, and thus the capacitor 12c-1 is charged by the voltage of the battery cell stack 2B.

After a predetermined time period has passed since the third pathway has been formed, the capacitor 12c-1 is discharged. More specifically, the third switch 12-3 and the fourth switch 12-4 are turned OFF, and the sixth switch 12-6 and the seventh switch 12-7 are turned ON. Thus, the second pathway is formed, and then the capacitor 12c-1 is discharged.

Since another end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned ON, into a digital value, and then outputs the converted value to the controller 14. Thus, the voltage of the battery cell stack 2B is detected.

Moreover, in a case where the capacitor 12c-1 is charged by the total voltage of the assembled battery 2, the first switch 12-1 and the fourth switch 12-4 are turned ON in FIG. 2, and the second switch 12-2 to the third switch 12-3 and the sixth switch 12-6 to the seventh switch 12-7 are turned OFF. Thus, a pathway (fourth pathway) is formed, including the assembled battery 2 and the capacitor 12c-1, and thus the capacitor 12c-1 is charged by the total voltage of the assembled battery 2.

After a predetermined time period has passed since the fourth pathway has been formed, the capacitor 12c-1 is discharged. More specifically, the first switch 12-1 and the fourth switch 12-4 are turned OFF, and the sixth switch 12-6 and the seventh switch 12-7 are turned ON. Thus, the second pathway is formed and then the capacitor 12c-1 is discharged.

Since another end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned ON, into a digital value, and then outputs the converted value to the controller 14. Thus, the total voltage of the assembled battery 2 is detected.

An insulation resistance Rp on a positive electrode side of the assembled battery 2 and an insulation resistance Rn on a negative electrode side of the assembled battery 2 are provided to the voltage detecting circuit 12. The insulation resistance Rp is an insulation resistance between the positive electrode side of the assembled battery 2 and the vehicle body of the vehicle. The insulation resistance Rn is an insulation resistance between the negative electrode side of the assembled battery 2 and the vehicle body of the vehicle. Deterioration of an insulation resistance of the vehicle is determined based on a voltage to be measured when the capacitor 12c-1 is charged by controlling the switches of the voltage detecting circuit 12 to be turned ON and OFF, as described later. The first embodiment employs a DC (direct current) voltage application method for measurement of the insulation resistance of the vehicle. However, the voltage application method is not limited to this, but a pulse voltage application method may be used.

Each of the insulation resistance Rp and the insulation resistance Rn shows a combined resistance generated by combining a resistance of a mounted resistor with a resistance virtually showing insulation from the ground of the vehicle body. Each of the insulation resistances Rp and Rn may be any one of a mounted resistor and a virtual resistance.

Resistance values of the insulation resistances Rp and Rn are, for example, some M, large enough to be hardly applied at a normal time. However, in an abnormal time in which the insulation resistance Rp or the insulation resistance Rn is deteriorated, the resistance value thereof is reduced to a value that allows the electricity to be conducted due to a short circuit of the assembled battery 2 to the ground of the vehicle body and the like or due to a state close to the short circuit.

The capacitor 12c-1 is charged and discharged to detect whether the insulation resistance Rp and the insulation resistance Rn are deteriorated. Here, the charging and the discharging of the capacitor 12c-1 will be described below. "Rp measurement" is a measurement process of detecting whether the insulation resistance Rp is deteriorated. In the Rp measurement, the fourth switch 12-4 and the sixth switch 12-6 are turned ON, and the second switch 12-2 to the third switch 12-3 and the seventh switch 12-7 are turned OFF. Thus, the insulation resistance Rp, the negative electrode side of the battery cell stack 2B, the fourth switch 12-4, the capacitor 12c-1, the sixth switch 12-6, the first resistor 12r-1 and the ground of the vehicle body are connected.

In other words, a pathway ("fifth pathway") is formed, connecting the insulation resistance Rp, the negative electrode side of the battery cell stack 2B, the fourth switch 12-4, the capacitor 12c-1, the sixth switch 12-6, the first resistor 12r-1 and the ground of the vehicle body. At this time, in a case where the resistance value of the insulation resistance Rp is normal, the fifth pathway little conducts the electricity so that the capacitor 12c-1 is not charged. On the other hand, in a case where the insulation resistance Rp is deteriorated so that the resistance value thereof is reduced, the fifth pathway conducts electricity so that the capacitor 12c-1 is charged from the positive electrode side (positive voltage).

After a predetermined time period has passed since the fifth pathway has been formed, for example, after the predetermined time period shorter than a time period necessary for the capacitor 12c-1 to be fully charged, the fourth switch 12-4 is turned OFF. Simultaneously, the seventh switch 12-7 is turned ON. Thus, the second pathway is formed, and then the capacitor 12c-1 is discharged.

Since another end of the sixth switch 12-6 is connected to the A/D converter 13 at the branch point A, the voltage of the capacitor 12c-1 is input to the A/D converter 13. The A/D converter 13 converts an analog voltage value ("voltage VRp") input immediately after the fourth switch 12-4 is turned OFF and the seventh switch 12-7 is turned ON, into a digital value, and then outputs the converted value to the controller 14. Thus, the voltage VRp is detected. The controller 14 detects, based on the voltage VRp, whether the insulation resistance Rp is deteriorated.

Moreover, "Rn measurement" is a measurement process of detecting whether the insulation resistance Rn is deteriorated. In the Rn measurement, the first switch 12-1 and the seventh switch 12-7 are turned ON, and the second switch 12-2 to the fourth switch 12-4 and the sixth switch 12-6 are turned OFF. Thus, the insulation resistance Rn, the positive electrode side of the battery cell stack 2A, the first switch 12-1, the capacitor 12c-1, the seventh switch 12-7, the second resistor 12r-2, and the ground of the vehicle body are connected.

In other words, a pathway ("sixth pathway") is formed, connecting the insulation resistance Rn, the positive electrode side of the battery cell stack 2A, the first switch 12-1, the capacitor 12c-1, the seventh switch 12-7, the second resistor 12r-2 and the ground of the vehicle body. At this time, in a case where the resistance value of the insulation resistance Rn is normal, the sixth pathway little conducts the electricity so that the capacitor 12c-1 is not charged. On the other hand, in a case where the insulation resistance Rn is deteriorated so that the resistance value thereof is reduced, the sixth pathway conducts electricity so that the capacitor 12c-1 is charged from the negative electrode side (negative voltage). The capacitor 12c-1 is charged from the negative electrode side (negative voltage) because there is a case where the body voltage is higher than the voltage of the assembled battery 2. When the insulation resistance Rn is deteriorated, the capacitor 12c-1 is charged from the negative electrode side. In a case where the insulation resistance Rn is not deteriorated, the capacitor 12c-1 is charged only from the positive electrode side.

After a predetermined time period has passed since the sixth pathway has been formed, for example, after the predetermined time period shorter than the time period necessary for the capacitor 12c-1 to be fully charged, the first switch 12-1 is turned OFF. Simultaneously, the sixth switch 12-6 is turned ON. Thus, the second pathway is formed, and then the capacitor 12c-1 is discharged.

Since another end of the sixth switch 12-6 is connected to the A/D converter 13 at the branch point A, the voltage of the capacitor 12c-1 is input to the A/D converter 13. The A/D converter 13 converts an analog voltage value ("voltage VRn") input immediately after the first switch 12-1 is turned OFF and the sixth switch 12-6 is turned ON, into a digital value, and then outputs the converted value to the controller 14. Thus, the voltage VRn is detected. The controller 14 detects, based on the voltage VRn, whether the insulation resistance Rn is deteriorated.

A voltage VRp1 and a voltage VRn1 are obtained from the Rp measurement and the Rn measurement, respectively, while the SMRs 3a and 3b are controlled to be OFF, and a voltage obtained from the voltage VRp1+the voltage VRn1 is a voltage Voff. Moreover, a voltage VRp2 and a voltage VRn2 are obtained from the Rp measurement and the Rn measurement, respectively, while the SMRs 3a and 3b are controlled to be ON, and a voltage obtained from the voltage VRp2+the voltage VRn2 is a voltage Von.

(A/D Converter)

The A/D converter 13 detects, at the branch point A (FIG. 2), the analog voltage value output from the voltage detecting circuit 12, and converts the detected analog voltage value into a digital voltage value. Then, the A/D converter 13 outputs the converted digital voltage value to the controller 14. The A/D converter 13 converts the input voltage into a voltage within a predetermined range so as to detect the voltage.

(Controller of the First Embodiment)

The controller 14 is a processing apparatus that is a microcomputer and the like including, for example, a central processing unit (CPU), a random access memory (RAM) and a read only memory (ROM). The controller 14 controls the entire battery management ECU 10 including the monitor IC 11a, the monitor IC 11b, the voltage detecting circuit 12, the A/D converter 13, etc. The controller 14 includes a charging pathway forming part 14a, a discharging pathway forming part 14b, a measuring part 14c and a determiner 14d.

The charging pathway forming part 14a controls turning-ON and turning-OFF of the first switch 12-1 to the seventh switch 12-7 (refer to FIG. 2) included in the voltage detecting circuit 12, and forms the charging pathway in the voltage detecting circuit 12. Moreover, the discharging pathway forming part 14b controls the turning-ON and the turning-OFF of the first switch 12-1 to the seventh switch 12-7 included in the voltage detecting circuit 12, and forms the discharging pathway in the voltage detecting circuit 12.

Switching patterns to switch the first switch 12-1 to the seventh switch 12-7 are stored beforehand in a memory, such as the RAM and the ROM. The charging pathway forming part 14a and the discharging pathway forming part 14b read out the switching pattern from the memory at an appropriate timing to form the charging pathway or the discharging pathway.

The measuring part 14c measures the voltage VRp and the voltage VRn based on the voltage of the charged capacitor 12c-1. The measuring part 14c charges the flying capacitor for a predetermined time period in the Rp measurement while the SMRs 3a and 3b are controlled to be OFF. Then, the measuring part 14c detects the voltage VRp1 of the charged flying capacitor. In other words, while the SMRs 3a and 3b are OFF, the fifth pathway is formed by the discharging pathway forming part 14b. Then, after the capacitor 12c-1 is charged for the predetermine time period, the second pathway is formed. Then, the measuring part 14c detects the voltage VRp1 of the charged capacitor 12c-1 via the A/D converter 13.

Similarly, the measuring part 14c charges the flying capacitor for the predetermined time period in the Rn measurement while the SMRs 3a and 3b are controlled to be OFF. Then, the measuring part 14c detects the voltage VRn1 of the charged flying capacitor. In other words, while the SMRs 3a and 3b are OFF, the sixth pathway is formed by the discharging pathway forming part 14b. Then, after the capacitor 12c-1 is charged for the predetermine time period, the second pathway is formed. The measuring part 14c detects the voltage VRn1 of the charged capacitor 12c-1 via the A/D converter 13.

The measuring part 14c receives, from the HV ECU 40, a measurement accepting signal indicative of a timing at which the Rp measurement or the Rn measurement is performed while the SMRs 3a and 3b are ON. Once receiving the measurement accepting signal, the measuring part 14c charges the flying capacitor for the predetermined time period in the Rp measurement while the SMRs 3a and 3b are controlled to be ON. Then, the measuring part 14c detects the voltage VRp2 of the charged flying capacitor. In other words, while the SMRs 3a and 3b are ON, the measuring part 14c receives the measurement accepting signal from the HV ECU 40. Once the measuring part 14c receives the measurement accepting signal, the fifth pathway is formed by the discharging pathway forming part 14b and the capacitor 12c-1 is charged for the predetermine time period. Then, once the second pathway is formed, the measuring part 14c detects the voltage VRp2 of the capacitor 12c-1 via the A/D converter 13.

Then, the measuring part 14c charges the flying capacitor for the predetermined time period in the Rn measurement while the SMRs 3a and 3b are controlled to be ON. Then, the measuring part 14c detects the voltage VRn2 of the charged flying capacitor. In other words, while the SMRs 3a and 3b are ON, the sixth pathway is formed by the discharging pathway forming part 14b. Then, after the capacitor 12c-1 is charged for the predetermine time period, the second pathway is formed. Then, the measuring part 14c detects the voltage VRn2 of the charged capacitor 12c-1 via the A/D converter 13.

The determiner 14d detects whether the insulation resistance Rp and the insulation resistance Rn are deteriorated, based on the measured voltages VRp1, VRp2, VRn1 and VRn2 of the measured capacitor 12c-1, on the total voltage of the assembled battery 2, etc. The total voltage of the assembled battery 2 may be a measured value or may be a value obtained from the HV ECU 40, the monitor IC 11a and/or the monitor IC 11b. In a case where the total voltage of the assembled battery 2 and a boost voltage are obtained, those voltages are obtained at a same time in which the voltages VRp and VRn are measured. Then, the determiner 14d outputs, to the HV ECU 40 (refer to FIG. 1) that is an upper apparatus, information showing a determination result of deterioration (insulation problem detection) of the insulation resistances Rp and Rn.

In other words, if the insulation resistance Rp or the insulation resistance Rn is deteriorated, a voltage charged to the capacitor 12c-1 increases. Therefore, in a case where the voltage of the charged capacitor 12c-1 increases, the deterioration of the insulation resistance Rp or the deterioration of the insulation resistance Rn is detected.

Moreover, the determiner 14d detects whether or not the SMRs 3a and/or 3b are welded based on the measured voltages VRp1, VRp2, VRn1, VRn2 and the like of the measured capacitor 12c-1. Then, the determiner 14d outputs, to the HV ECU 40 (refer to FIG. 1) that is the upper apparatus, information showing a determination result of whether the SMRs 3a and/or 3b are welded (weld determination result).

For example, the measuring part 14c measures the voltages VRp1, VRp2, VRn1 and VRn2 of the capacitor 12c-1. At that time, where the voltage Voff=VRp1+VRn1 and also the voltage Von=VRp2+VRn2, a voltage difference ΔV=Von−Voff is equal to or smaller than a predetermined threshold, the determiner 14d determines whether or not the SMRs 3a and/or 3b are welded.

For example, if VRp 2≥VRn2, the determiner 14d determines that the SMR 3a (hereinafter referred also to as SMR B or B-axis SMR) is welded. On the other hand, if VRp2<VRn2, the determiner 14d determines that the SMR 3b (hereinafter referred also to as SMR G or G-axis SMR) is welded. Here, if VRp2=VRn2, the determiner 14d may determine that the SMR 3a and the SMR 3b are both welded, or the determiner 14d may inform the HV ECU 40 that weld determination is impossible.

Moreover, the voltage difference ΔV=Von−Voff is greater than the predetermined threshold, the determiner 14d determines that there is no welded portion with the SMR 3a and the SMR 3b. Then, the determiner 14d informs the HV ECU 40 of the weld determination result.

The weld determination described above uses the threshold value. However, a ratio may be used for the weld determination. Moreover, the predetermined threshold value may be a fixed specification value set forth beforehand or may be a value derived based on a statistical result of statistics on values derived from the voltage VRp+the voltage VRn in a range in which a problem is not falsely detected. Moreover, in a case where a derived value is equal to the threshold value, defining the case as any of the aforementioned determination is merely a matter of design choice. For example, if ΔV=Von−Voff is smaller than the predetermined threshold value, the determiner 14d may determine whether or not the SMRs 3a and 3b are welded, and if ΔV=Von−Voff is equal to or greater than the predetermined threshold value, the determiner 14d may determine that there is no welded portion with the SMRs 3a and 3b.

(PCU)

The PCU 20 boosts a voltage of the power supply that supplies the power to the motor 4 and other electronic and electrical equipment of the vehicle, and also converts the voltage from DC voltage to AC voltage. As illustrated in FIG. 1, the PCU 20 is connected to the positive and negative electrode sides of the assembled battery 2. The PCU 20 includes a DCDC converter 21, a three-phase inverter 22, a low voltage-side smoothing capacitor 23a and a high voltage-side smoothing capacitor 23b.

(MG ECU)

The MG ECU 30 is an electronic control apparatus that monitors a state of the PCU 20 and that controls the PCU 20. More specifically, the MG ECU 30 monitors operating states of the DCDC converter 21 and the three-phase inverter 22, and also monitors charged states of the low voltage-side smoothing capacitor 23a and the high voltage-side smoothing capacitor 23b. Moreover, the MG ECU 30 obtains information showing whether the voltage has been boosted by the PCU 20 and information showing the charged states of the low voltage-side smoothing capacitor 23a and the high voltage-side smoothing capacitor 23b, and then informs the HV ECU 40 that is the upper apparatus thereof of the obtained information. Moreover, the MG ECU 30 controls operations of the PCU 20 in accordance with a command from the HV ECU 40.

(HV ECU)

The HV ECU 40 receives a monitoring result of the charged state and the like of the assembled battery 2 from the battery management ECU 10 and the information showing whether the voltage has been boosted by the PCU 20 and the information showing the charged states of the low voltage-side smoothing capacitor 23a and the high voltage-side smoothing capacitor 23b from the MG ECU 30. Then, the HV ECU 40 controls the vehicle, including control of the battery management ECU 10 and the MG ECU 30, in accordance with the received monitoring result and the received information. Moreover, the HV ECU 40 controls turning-ON and turning-OFF of the SMRs 3a and 3b.

Moreover, the HV ECU 40 sends the measurement accepting signal to the battery management ECU 10. The measurement accepting signal is sent when charge of the high voltage-side smoothing capacitor 23b (or the voltages of the low voltage-side smoothing capacitor 23a and the high voltage-side smoothing capacitor 23b) can be regarded as being completed because the voltage thereof exceeds a predetermined voltage after the SMRs 3a and 3b are turned ON. Moreover, the measurement accepting signal is a signal indicative of the timing at which the battery management ECU 10 is allowed to perform the Rp measurement and the Rn measurement to be performed when the SMRs 3a and 3b are ON. Once receiving the measurement accepting signal from the HV ECU 40 while the SMRs 3a and 3b are ON, the battery management ECU 10 performs the Rp measurement and the Rn measurement to be performed when the SMRs 3a and 3b are ON.

(Weld Detection Process of the First Embodiment)

Figure 3A:
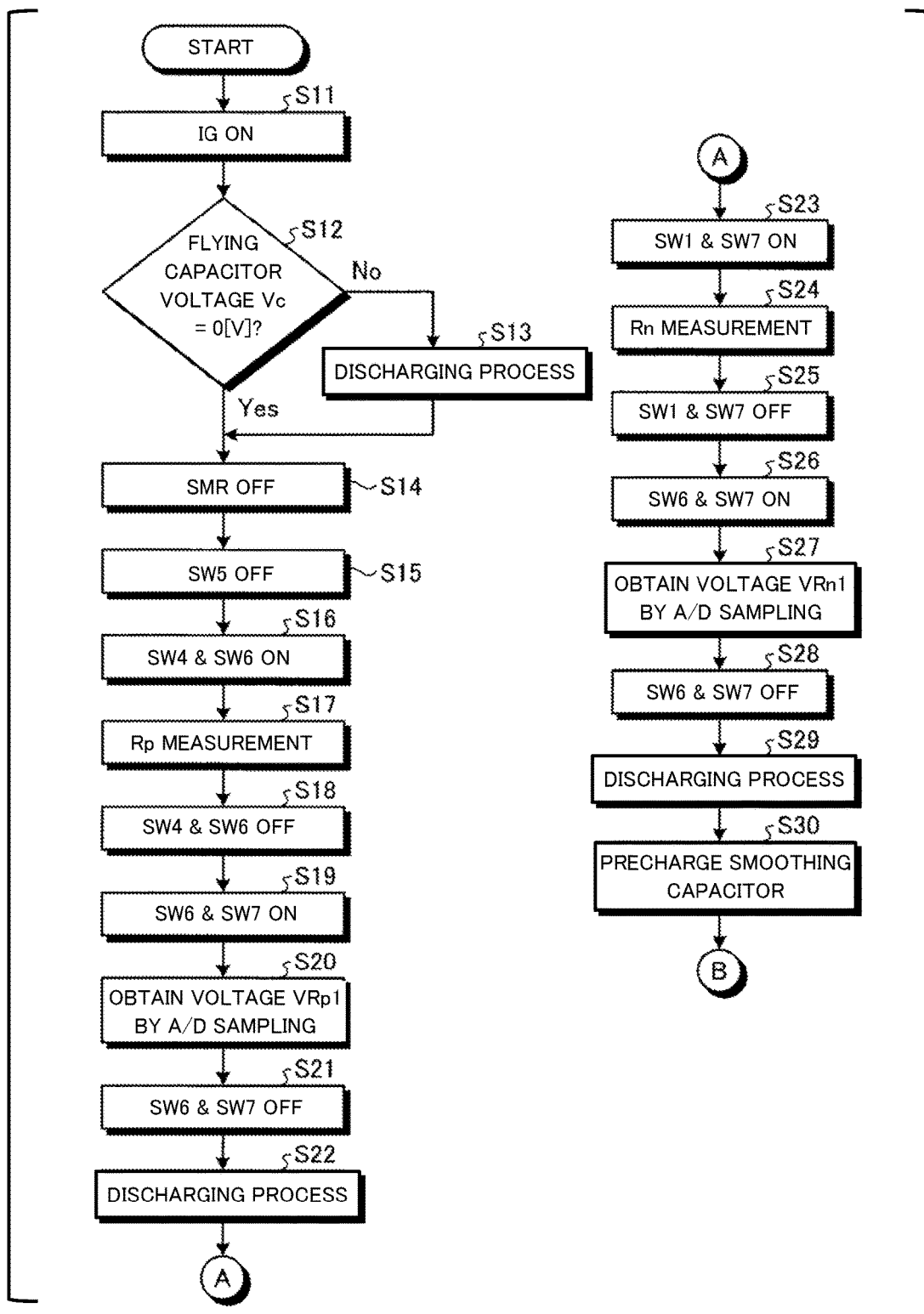
FIG. 3A is a flowchart (No. 1) showing an example of a weld detection process of the first embodiment.
Figure 3B:
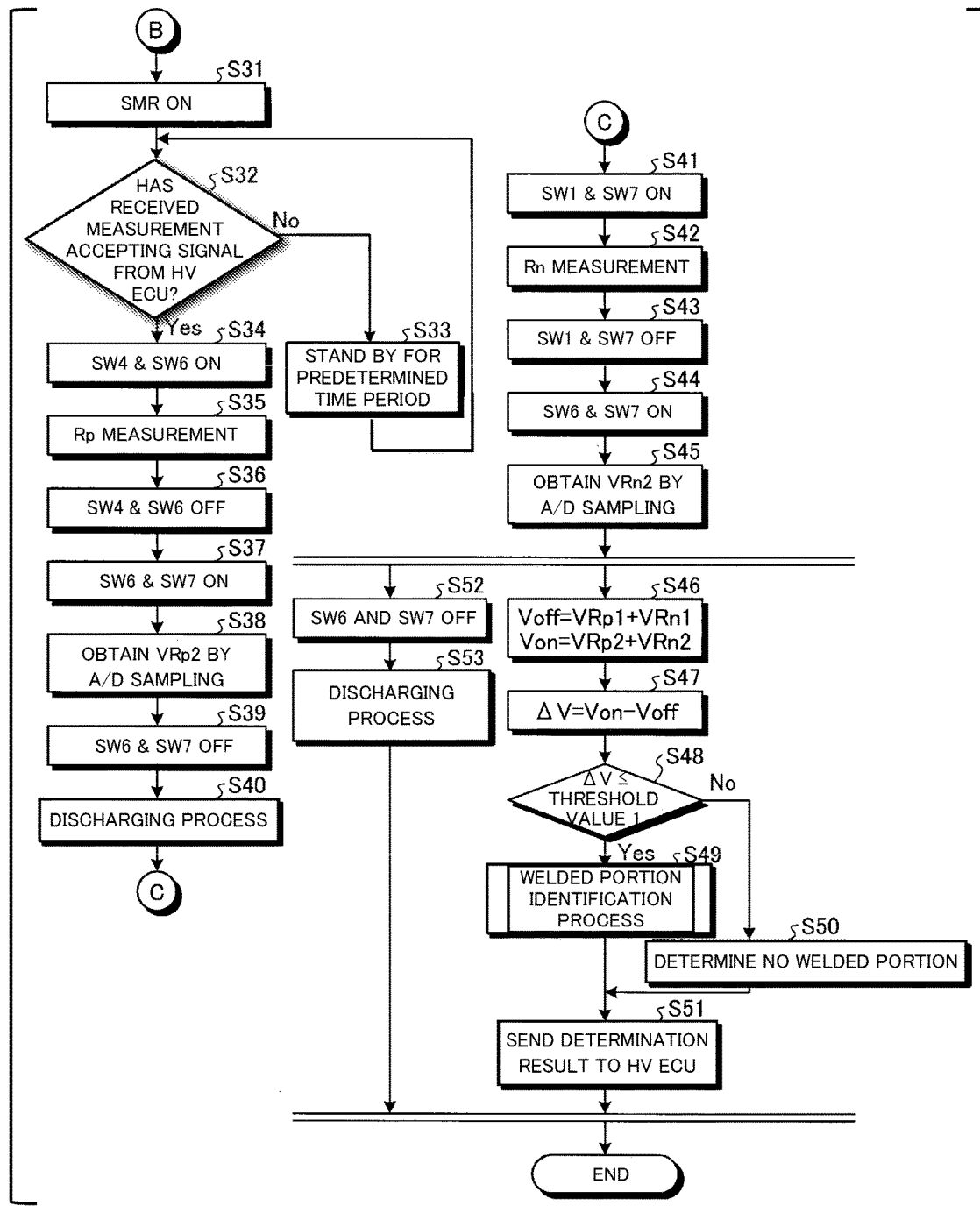
FIG. 3B is a flowchart (No. 2) showing an example of the weld detection process of the first embodiment.

FIG. 3A is a flowchart (No. 1) showing an example of a weld detection process of the first embodiment. FIG. 3B is a flowchart (No. 2) showing an example of the weld detection process of the first embodiment. The weld detection process of the first embodiment is performed by the controller 14 of the battery management ECU 10 once the vehicle is started. Each step of the flowchart is repeatedly performed in a predetermined time cycle.

In the description below, the first switch 12-1, the second switch 12-2, the third switch 12-3 and the fourth switch 12-4 illustrated in FIG. 2 are abbreviated as "SW1," "SW2," "SW3" and "SW4," respectively. Similarly, the fifth switch 12-5, the sixth switch 12-6 and the seventh switch 12-7 illustrated in FIG. 2 are abbreviated as "SW5," "SW6," and "SW7," respectively.

As shown in FIG. 3A, the controller 14 first detects start (IG ON: ignition ON) of the vehicle that is started by an instruction of the HV ECU 40 (a step S11). Next, the measuring part 14c determines whether or not a voltage Vc of the flying capacitor (i.e., the capacitor 12c-1) is zero (or substantially zero), i.e., a state in which the flying capacitor is sufficiently discharged (a step S12). In a case where the voltage Vc of the flying capacitor is zero (Yes in the step S12), the measuring part 14c moves the process to a step S14. On the other hand, the voltage Vc of the flying capacitor is not zero (No in the step S12), the measuring part 14c moves the process to a step S13.

In the step S13, the discharging pathway forming part 14b forms the discharging pathway to perform a discharging process for the flying capacitor (i.e. the capacitor 12c-1). Once the step S13 ends, the controller 14 moves the process to the step S14.

Next, the controller 14 controls the SMRs 3a and 3b to turned OFF via the HV ECU 40 (the step S14). Next, the charging pathway forming part 14a turns OFF the SW5 to separate the capacitor 12c-2 from the voltage detecting circuit 12 so that only the capacitor 12c-1 consists of the flying capacitor (a step S15). This switching process eliminates an overhead process, such as precharge. Thus, the weld detection process can be speedily performed, using the flying capacitor of which capacitance is relatively small and that is speedily charged. This switching process is omitted if the flying capacitor does not have to be switched. Moreover, instead of the step S15, the charging pathway forming part 14a may configure the flying capacitor with the capacitors 12c-1 and 12c-2 by turning ON the SW5 and then connecting the capacitor 12c-2 to the voltage detecting circuit 12. Thus, the flying capacitor having relatively large capacitance is charged. By measuring a voltage of the flying capacitor, stray capacitance and other factors can be excluded.

Next, the charging pathway forming part 14a turns ON the SW4 and the SW6 (a step S16). The foregoing fifth charging pathway is formed by performing the step S16, and then the Rp measurement is performed so that the flying capacitor is charged for the predetermined time period (a step S17). Next, the charging pathway forming part 14a turns OFF the SW4 and the SW6 (a step S18). Next, the discharging pathway forming part 14b turns ON the SW6 and the SW7 (a step S19). Next, the measuring part 14c obtains the voltage VRp1 based on the voltage of the flying capacitor sampled by the A/D converter 13 (a step S20). Next, the discharging pathway forming part 14b turns OFF the SW6 and the SW7 (a step S21). Simultaneously, the discharging pathway forming part 14b turns ON the SW2 and the SW3 to perform the discharging process for the flying capacitor (a step S22).

Next, the charging pathway forming part 14a turns ON the SW1 and the SW7 (a step S23). As a result of the step S23, the sixth charging pathway is formed and the Rn measurement is performed to charge the flying capacitor for the predetermined time period (a step S24). Next, the charging pathway forming part 14a turns OFF the SW1 and the SW7 (a step S25). Next, the discharging pathway forming part 14b turns ON the SW6 and the SW7 (a step S26). Next, the measuring part 14c obtains the voltage VRn1 based on the voltage of the flying capacitor sampled by the A/D converter 13 (a step S27). Next, the discharging pathway forming part 14b turns OFF the SW6 and the SW7 (a step S28). At the same time, the discharging pathway forming part 14b turns ON the SW2 and the SW3 to perform the discharging process for the flying capacitor (a step S29). Next, the controller 14 precharges the low voltage-side smoothing capacitor 23a and the high voltage-side smoothing capacitor 23b via the HV ECU 40 and the PCU 20 (a step S30).

The precharge in the step S30 prevents the SMRs from being welded. Moreover, after the SMRs 3a and 3b are controlled to be turned ON in a step S31, described later, full charge of the low voltage-side smoothing capacitor 23a and the high voltage-side smoothing capacitor 23b is completed faster. Thus, the controller 14 receives the measurement accepting signal faster in a step S32, described later. Here, the measurement accepting signal is sent from the HV ECU 40 when the charge of the high voltage-side smoothing capacitor 23b (or the voltages of the low voltage-side smoothing capacitor 23a and the high voltage-side smoothing capacitor 23b) can be regarded as being completed because the voltage thereof exceeds the predetermined voltage. Thus, the controller 14 completes the weld detection process speedily.

Next, as shown in FIG. 3B, the controller 14 controls the SMRs (SMR B and SMR G, i.e., the SMR 3a and the SMR 3b) to be turned ON (the step S31). Next, the controller 14 determines whether or not the controller 14 has received the measurement accepting signal from the HV ECU 40 (the step S32). In a case where the controller 14 has received the measurement accepting signal from the HV ECU 40 (Yes in the step S32), the controller 14 moves the process to a step S34. On the other hand, in a case where the controller 14 has not received the measurement accepting signal from the HV ECU 40 (No in the step S32), the controller 14 moves the process to a step S33. In the step S33, the controller 14 stands by for a predetermined time period. Once the step S33 ends, the controller 14 moves the process to the step S32.

In the step S34, the charging pathway forming part 14a turns ON the SW4 and the SW6. As a result of the step S34, the foregoing fifth charging pathway is formed and the Rp measurement is performed to charge the flying capacitor for the predetermined time period (a step S35). Next, the charging pathway forming part 14a turns OFF the SW4 and the SW6 (a step S36). Next, the discharging pathway forming part 14b turns ON the SW6 and the SW7 (a step S37). Next, the measuring part 14c obtains the voltage VRp2 based on the voltage of the flying capacitor sampled by the A/D converter 13 (a step S38). Next, the discharging pathway forming part 14b turns OFF the SW6 and the SW7 (a step S39). Simultaneously, the discharging pathway forming part 14b turns ON the SW2 and the SW3 to perform the discharging process for the flying capacitor (a step S40).

Next, the charging pathway forming part 14a turns ON the SW1 and the SW7 (a step S41). As a result of the step S41, the foregoing sixth charging pathway is formed and the Rn measurement is performed to charge the flying capacitor for the predetermined time period (a step S42). Next, the charging pathway forming part 14a turns OFF the SW1 and the SW7 (a step S43). Next, the discharging pathway forming part 14b turns ON the SW6 and the SW7 (a step S44). Next, the measuring part 14c obtains the voltage VRn2 based on the voltage of the flying capacitor sampled by the A/D converter 13 (a step S45).

Once the step S45 ends, steps S46 to S51 and the steps S52 to S53 are performed in parallel.

In the step S46, the determiner 14d calculates the voltage Voff and the voltage Von based on Voff=VRp1+VRn1 and Von=VRp2+VRn2. Next, the determiner 14d calculates the voltage difference ΔV based on ΔV=Von−Voff (a step S47). Next, the determiner 14d determines whether or not the voltage difference ΔV is equal to or smaller than a threshold value 1 (a step S48). In a case where the voltage difference ΔV is equal to or smaller than the threshold value 1 (Yes in the step S48), the determiner 14d moves the process to a step S49. On the other hand, in a case where the voltage difference ΔV is greater than the threshold value 1 (No in the step S48), the determiner 14d moves the process to a step S50.

In the step S49, the determiner 14d performs a welded portion identification process, described later with reference to FIG. 4. On the other hand, in the step S50, the determiner 14d determines that there is no welded portion with the SMRs 3a and 3b. Once the step S49 or the step S50 ends, the controller 14 moves the process to a step S51. The controller 14 sends, to the HV ECU 40, a determination result of the step S49 or the step S50.

Meanwhile, the discharging pathway forming part 14b turns OFF the SW6 and the SW7 (a step S52). Simultaneously, the discharging pathway forming part 14b turns ON the SW2 and the SW3 to perform the discharging process for the flying capacitor (a step S53). Once the step S51 and the step S53 end, the controller 14 ends the weld detection process.

The steps S16 to S22 described above are the Rp measurement and the steps S23 to S29 are the Rn measurement. In order to smooth fluctuation and the like of the boost voltage of the PCU 20 and the total voltage of the assembled battery 2 while the flying capacitor is being charged, an average of voltages obtained by repeating the steps S16 to S22 a predetermined number of times may be used as a finalized voltage VRp1. Similarly, an average of voltages obtained by repeating the steps S23 to the S29 a predetermined number of times may be used as a finalized voltage VRn1.

An order of performing two process groups, one of which is the Rp measurement from the step S16 to the step S22 and the other of which is the Rn measurement from the step S23 to the step S29, may be changed if an order of process steps in each group is not changed. In other words, the Rp measurement may be performed after the Rn measurement.

Similarly, the steps S34 to S40 described above are the Rp measurement. Moreover, the steps S41 to S45, the step S52 and the step S53 are the Rn measurement. In order to smooth fluctuation and the like of the boost voltage of the PCU 20 and the total voltage of the assembled battery 2 while the flying capacitor is being charged, an average of voltages obtained by repeating the steps S34 to S40 a predetermined number of times may be used as a finalized voltage VRp2. Similarly, an average of voltages obtained by repeating the steps S41 to the S45, the step S52 and the step S53 a predetermined number of times may be used as a finalized voltage VRn2.

An order of performing two process groups, one of which is the Rp measurement from the step S34 to the step S40 and the other of which is the Rn measurement from the step S41 to the step S45, the step S52 and the step S53 may be changed if an order of process steps in each group is not changed. In other words, the Rp measurement may be performed after the Rn measurement.

(Welded Portion Identification Process of the First Embodiment)

Figure 4:
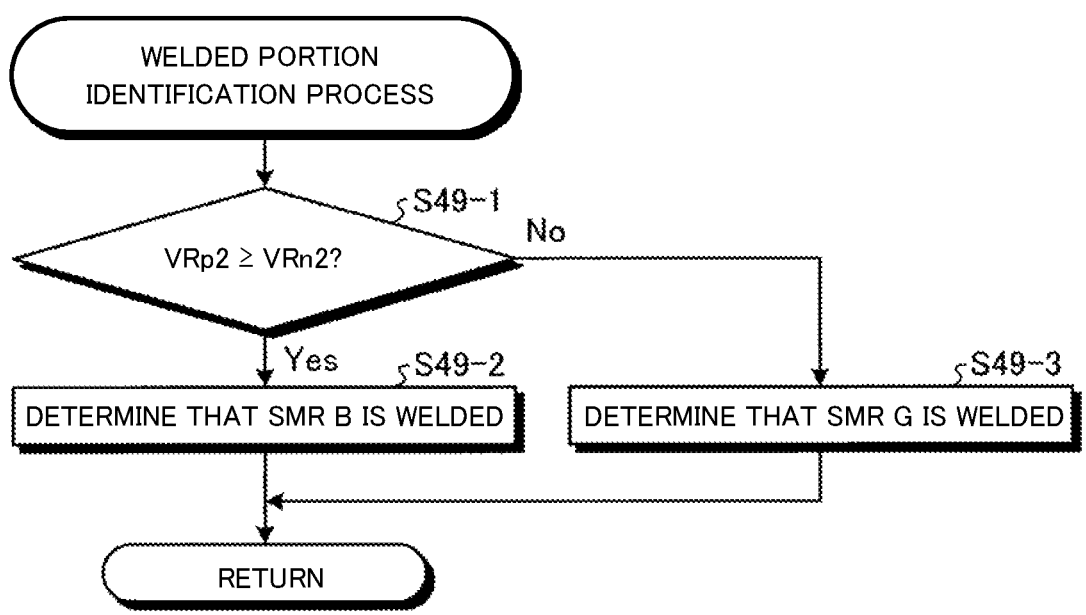
FIG. 4 is a flowchart showing an example of a welded portion identification process of the first embodiment.

FIG. 4 is a flowchart showing an example of the welded portion identification process of the first embodiment. FIG. 4 shows a subroutine of the step S49 in FIG. 3B.

First, the determiner 14d determines whether or not VRp2≥VRn2 for VRp2 and VRn2 (a step S49-1). In a case where VRp2≥VRn2 (Yes in the step S49-1), the determiner 14d moves the process to a step S49-2. On the other hand, in a case where VRp2<VRn2 (No in the step S49-1), the determiner 14d moves the process to a step S49-3.

In the step S49-2, the determiner 14d determines that the SMR B (i.e. the SMR 3a) is welded in an ON-state. On the other hand, in the step S49-3, the determiner 14d determines that the SMR G (i.e. the SMR 3b) is welded in the ON-state. In a case where VRp2=VRn2 in the step S49-1, the determiner 14d may determine that both of the SMR B (i.e. the SMR 3a) and the SMR G (i.e. the SMR 3b) are welded in the ON-state. Once the step 49-2 or the step 49-3 ends, the determiner 14d ends the welded portion identification process and also ends the weld detection process shown in FIG. 3B.

(Measurement Accepting Signal Sending Process Performed by the HV ECU of the First Embodiment)

Figure 5:
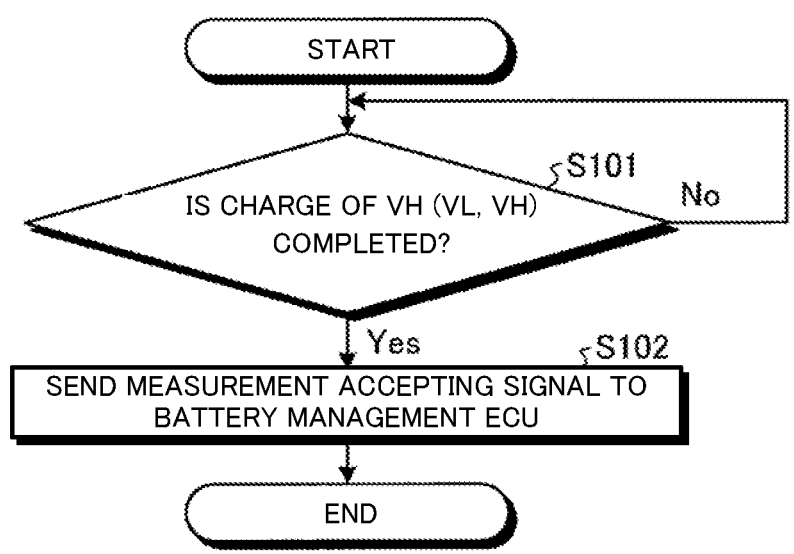
FIG. 5 is a flowchart showing an example of a measurement accepting signal sending process performed by an HV ECU of the first embodiment.

FIG. 5 is a flowchart showing an example of a measurement accepting signal sending process performed by the HV ECU of the first embodiment. The HV ECU 40 sends the measurement accepting signal to the battery management ECU 10 when the charge of the high voltage-side smoothing capacitor 23b (or the low voltage-side smoothing capacitor 23a and the high voltage-side smoothing capacitor 23b) can be regarded as being completed because the voltage of the high voltage-side smoothing capacitor 23b informed from the MG ECU 30 exceeds the predetermined voltage.

As shown in FIG. 5, the HV ECU 40 first controls the SMRs 3a and 3b to be turned ON, and then determines, by measuring the voltages of the high voltage-side smoothing capacitor 23b at both sides thereof, whether or not charge of the high voltage-side smoothing capacitor 23b (VH) (or the low voltage-side smoothing capacitor 23a (VL) and the high voltage-side smoothing capacitor 23b (VH)) is completed (a step S101). In a case where the charge of the high voltage-side smoothing capacitor 23b (or the low voltage-side smoothing capacitor 23a and the high voltage-side smoothing capacitor 23b) is completed after the HV ECU 40 has controlled the SMRs 3a and 3b to be turned ON (Yes in the step S101), the HV ECU 40 moves the process to a step S102. On the other hand, in a case where the charge of the high voltage-side smoothing capacitor 23b (or the low voltage-side smoothing capacitor 23a and the high voltage-side smoothing capacitor 23b) is not completed after the HV ECU 40 has controlled the SMRs 3a and 3b to be turned ON (No in the step S101), the HV ECU 40 repeats the step S101.

In the step S102, the HV ECU 40 sends the measurement accepting signal to the battery management ECU 10. Once the step S102 ends, the HV ECU 40 ends the measurement accepting signal sending process.

(Timing Chart of the Weld Detection Process of the First Embodiment)

Figure 6:
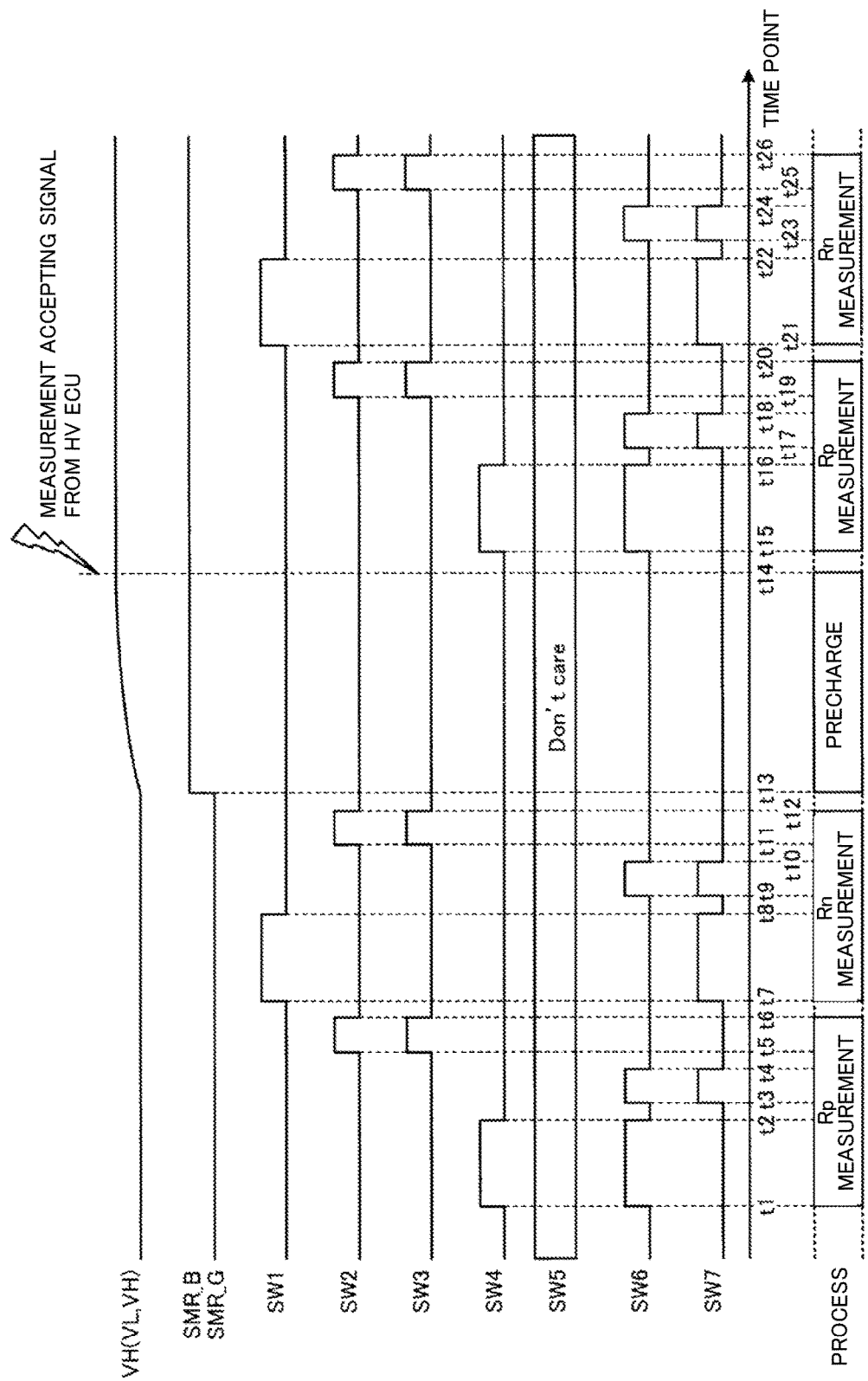
FIG. 6 is a timing chart showing an example of the weld detection process of the first embodiment.

FIG. 6 is a timing chart showing an example of the weld detection process of the first embodiment. As shown in FIG. 6, the battery management ECU 10 performs the Rp measurement in a time period from a time point t1 to a time point t6. The battery management ECU 10 turns ON the SW4 and the SW6 in a time period from the time point t1 to a time point t2 to charge the flying capacitor (battery charge) in the Rp measurement.

Moreover, the battery management ECU 10 turns ON the SW6 and the SW7 in a time period from a time point t3 to a time point t4 and then measures the voltage VRp1 based on the voltage of the flying capacitor sampled by the A/D converter 13. Then, the battery management ECU 10 turns ON the SW2 and the SW3 in a time period from a time point t5 to the time point t6 to discharge the flying capacitor.

The battery management ECU 10 performs the Rn measurement in a time period from a time point t7 to a time point t12. The battery management ECU 10 turns ON the SW1 and the SW7 in a time period from the time point t7 to a time point t8 to charge the flying capacitor (battery charge) in the Rn measurement.

Moreover, the battery management ECU 10 turns ON the SW6 and the SW7 in a time period from a time point t9 to a time point t10 and then measures the voltage VRn1 based on the voltage of the flying capacitor sampled by the A/D converter 13. Then, the battery management ECU 10 turns ON the SW2 and the SW3 in a time period from a time point t11 to the time point t12 to discharge the flying capacitor.

Next, the battery management ECU 10 controls the SMR B and the SMR G (i.e. the SMR 3a and the SMR 3b) at a time point t13 and after to be in the ON-state from an OFF-state. Due to the control, the high voltage-side smoothing capacitor 23b (or the low voltage-side smoothing capacitor 23a and the high voltage-side smoothing capacitor 23b) is precharged so that the high voltage-side smoothing capacitor 23b is substantially fully charged by a time point t14.

Then, the battery management ECU 10 receives the measurement accepting signal from the HV ECU 40 at the time point t14. Then, the battery management ECU 10 performs the Rp measurement in a time period from a time point t15 to a time point t20 once receiving the measurement accepting signal from the HV ECU 40. The battery management ECU 10 turns ON the SW4 and the SW6 in a time period from the time point t15 to a time point t16 to charge the flying capacitor (battery charge) in the Rp measurement.

Moreover, the battery management ECU 10 turns ON the SW6 and the SW7 in a time period from a time point t17 to a time point t18 and then measures the voltage VRp2 based on the voltage of the flying capacitor sampled by the A/D converter 13. Then, the battery management ECU 10 turns ON the SW2 and the SW3 in a time period from a time point t19 to a time point t20 to discharge the flying capacitor.

The battery management ECU 10 performs the Rn measurement in a time period from a time point t21 to a time point t26. The battery management ECU 10 turns ON the SW1 and the SW7 in a time period from the time point t21 to a time point t22 to charge the flying capacitor (battery charge) in the Rn measurement.

Moreover, the battery management ECU 10 turns ON the SW6 and the SW7 in a time period from a time point t23 to a time point t24 and then measures the voltage VRn2 based on the voltage of the flying capacitor sampled by the A/D converter 13. Then, the battery management ECU 10 turns ON the SW2 and the SW3 in a time period from a time point t25 to the time point t26 to discharge the flying capacitor.

The first embodiment performs the weld detection for the SMRs 3a and 3b based on the voltage difference ΔV between the voltage Voff measured when the SMRs 3a and 3b are controlled to be OFF and the voltage Von measured when the SMRs 3a and 3b are controlled to be ON. Thus, the first embodiment reduces influence of charge of the low voltage-side smoothing capacitor 23a, the high voltage-side smoothing capacitor 23b, etc. located after the SMRs 3a and 3b, and also reduces an error of the measured voltages of the flying capacitor so that weld of the SMRs 3a and 3b can be detected accurately.

Moreover, the first embodiment measures the voltage Von in an appropriate measurement timing based on the charged state of the high voltage-side smoothing capacitor 23b (or the low voltage-side smoothing capacitor 23a and the high voltage-side smoothing capacitor 23b) when the ignition of the vehicle is turned ON. Therefore, the first embodiment prevents time loss in waiting for precharge of the high voltage-side smoothing capacitor 23b (or the low voltage-side smoothing capacitor 23a and the high voltage-side smoothing capacitor 23b). Moreover, the first embodiment reduces a measuring error that is caused by measuring the voltage Von before the precharge of the high voltage-side smoothing capacitor 23b (or the low voltage-side smoothing capacitor 23a and the high voltage-side smoothing capacitor 23b) is completed. As described above, since the first embodiment determines a timing to measure the voltage Von for each measurement, according to the charged state of the high voltage-side smoothing capacitor 23b (or the low voltage-side smoothing capacitor 23a and the high voltage-side smoothing capacitor 23b), the process is efficiently performed and a time period for the process is shortened and, simultaneously, accuracy of the process is improved as compared to a fixed measurement timing of the voltage Von.

Second Embodiment

In the first embodiment, when the vehicle is started (ignition ON), the SMRs 3a and 3b are controlled to be ON after the voltage Voff is measured. Then, the voltage Von is measured once the measurement accepting signal is received from the HV ECU 40 in accordance with completion of the precharge of the high voltage-side smoothing capacitor 23b (or the low voltage-side smoothing capacitor 23a and the high voltage-side smoothing capacitor 23b). However, when the vehicle is shut down (ignition OFF), the SMRs 3a and 3b are controlled to be OFF after the voltage Von is measured. Then, the voltage Voff may be measured once the measurement accepting signal is received from the HV ECU 40 in accordance with completion of discharge of the high voltage-side smoothing capacitor 23b (or the low voltage-side smoothing capacitor 23a and the high voltage-side smoothing capacitor 23b). This case will be described below as a second embodiment.

A vehicle-mounted system 1-2 of the second embodiment includes a battery management ECU 10-2 (refer to FIG. 1). The battery management ECU 10-2 includes a controller 14-2 (refer to FIG. 1). The controller 14-2 includes a measuring part 14c-2 (refer to FIG. 1). Moreover, the vehicle-mounted system 1-2 includes an HV ECU 40-2. Other elements of a configuration of the vehicle-mounted system 1-2 are the same as the configuration of the first embodiment.

The measuring part 14c-2 charges a flying capacitor for a predetermined time period in a Rp measurement while SMRs 3a and 3b are controlled to be ON. Then, the measuring part 14c-2 detects a voltage VRp2 of the charged flying capacitor. In other words, while the SMRs 3a and 3b are ON, a fifth pathway is formed by a discharging pathway forming part 14b. Then, after the capacitor 12c-1 is charged for the predetermine time period, a second pathway is formed. Then, the measuring part 14c-2 detects the voltage VRp2 of the capacitor 12c-1 via an A/D converter 13.

Similarly, the measuring part 14c-2 charges the flying capacitor for the predetermined time period in the Rn measurement while the SMRs 3a and 3b are controlled to be ON. Then, the measuring part 14c-2 detects a voltage VRn2 of the charged flying capacitor. While the SMRs 3a and 3b are OFF, a sixth pathway is formed by the discharging pathway forming part 14b. Then, after the capacitor 12c-1 is charged for the predetermine time period, the second pathway is formed. Then, the measuring part 14c-2 detects the voltage VRn2 of the capacitor 12c-1 via the A/D converter 13.

Moreover, the measuring part 14c-2 receives, from the HV ECU 40-2, a measurement accepting signal indicative of a timing at which the Rp measurement and the Rn measurement can be performed when the SMRs 3a and 3b are OFF. Then, once receiving the measurement accepting signal, the measuring part 14c-2 charges the flying capacitor for the predetermined time period in the Rp measurement while the SMRs 3a and 3b are controlled to be ON. Then, the measuring part 14c-2 detects a voltage VRp1 of the charged flying capacitor. In other words, while the SMRs 3a and 3b are ON, the measuring part 14c-2 receives the measurement accepting signal from the HV ECU 40-2. Then, after the fifth pathway is formed by the discharging pathway forming part 14b, the capacitor 12c-1 is charged for the predetermine time period. Then, once the second pathway is formed, the measuring part 14c-2 detects the voltage VRp1 of the capacitor 12c-1 via the A/D converter 13.

Then, the measuring part 14c-2 charges the flying capacitor for the predetermined time period in the Rn measurement while the SMRs 3a and 3b are controlled to be OFF. Then, the measuring part 14c-2 detects a voltage VRn1 of the charged flying capacitor. In other words, while the SMRs 3a and 3b are ON, the measuring part 14c-2 receives the measurement accepting signal from the HV ECU 40-2. Then, after the measuring part 14c-2 receives the measurement accepting signal, the sixth pathway is formed by the discharging pathway forming part 14b. Then, after the capacitor 12c-1 is charged for the predetermine time period, the second pathway is formed. Then, the measuring part 14c-2 detects the voltage VRn1 of the capacitor 12c-1 via the A/D converter 13.

The HV ECU 40-2 controls the SMRs 3a and 3b to be OFF. Then, in a case where discharge of the high voltage-side smoothing capacitor 23b (or the voltages of the low voltage-side smoothing capacitor 23a and the high voltage-side smoothing capacitor 23b) can be regarded as being completed, the HV ECU 40-2 sends the measurement accepting signal to the battery management ECU 10-2. The case where the discharge of the high voltage-side smoothing capacitor 23b can be regarded as being completed is a case in which a voltage of the high voltage-side smoothing capacitor 23b (or the voltages of the low voltage-side smoothing capacitor 23a and the high voltage-side smoothing capacitor 23b) is smaller than a predetermined voltage. In other words, the measurement accepting signal of the second embodiment is a signal indicative of the timing at which the battery management ECU 10 is allowed to perform the Rp measurement and the Rn measurement to be performed when the SMR 3a and SMR 3b are OFF. Once receiving the measurement accepting signal from the HV ECU 40-2 while the SMR 3a and SMR 3b are OFF, the battery management ECU 10-2 performs the Rp measurement and the Rn measurement to be performed when the SMR 3a and SMR 3b are OFF.

(Timing Chart of the Weld Detection Process of the Second Embodiment)

Figure 7:
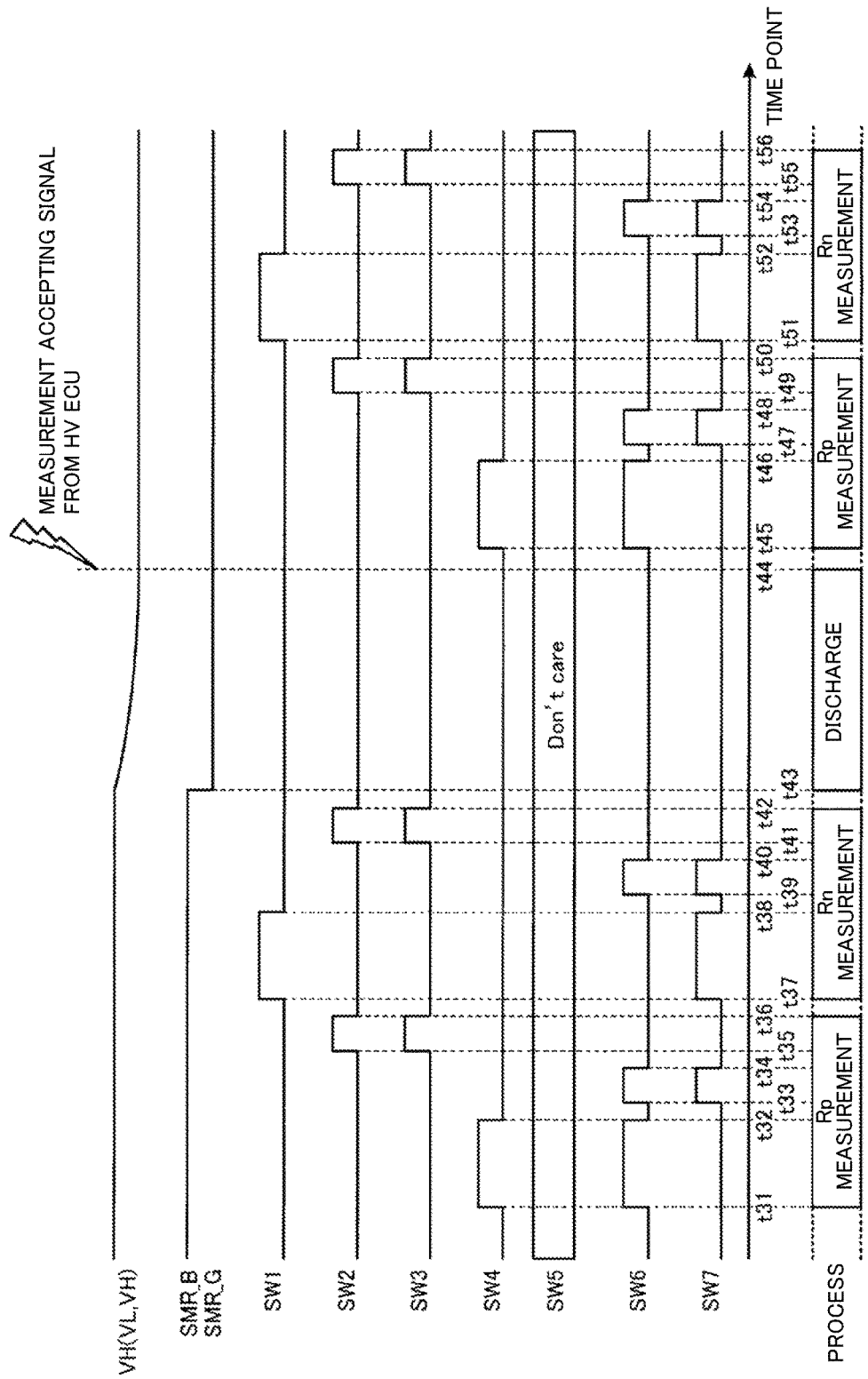
FIG. 7 is a timing chart showing an example of a weld detection process of a second embodiment

FIG. 7 is a timing chart showing an example of a weld detection process of the second embodiment. As shown in FIG. 7, the battery management ECU 10-2 performs the Rp measurement in a time period from a time point t31 to a time point t36. The battery management ECU 10-2 turns ON a SW4 and a SW6 in a time period from the time point t31 to a time point t32 to charge the flying capacitor (battery charge) in the Rp measurement.

Moreover, the battery management ECU 10-2 turns ON the SW6 and a SW7 in a time period from a time point t33 to a time point t34 and then measures the voltage VRp2 by A/D sampling of the voltage of the flying capacitor. Then, the battery management ECU 10-2 turns ON a SW2 and a SW3 in a time period from a time point t35 to the time point t36 to discharge the flying capacitor.

Moreover, the battery management ECU 10-2 performs the Rn measurement in a time period from a time point t37 to a time point t42. The battery management ECU 10-2 turns ON a SW1 and the SW7 in a time period from the time point t37 to a time point t38 to charge the flying capacitor (battery charge) in the Rn measurement.

Moreover, the battery management ECU 10-2 turns ON the SW6 and the SW7 in a time period from a time point t39 to a time point t40 and then measures the voltage VRn2 by A/D sampling of the voltage of the flying capacitor. Then, the battery management ECU 10-2 turns ON the SW2 and the SW3 in a time period from a time point t41 to a time point t42 to discharge the flying capacitor.

Next, the battery management ECU 10-2 controls the SMR B and the SMR G (i.e. the SMR 3a and the SMR 3b) at a time point t43 and after to be in an OFF-state from an ON-state. Due to this control, the high voltage-side smoothing capacitor 23b (or the low voltage-side smoothing capacitor 23a and the high voltage-side smoothing capacitor 23b) is discharged to be in a substantially zero [V] state by a time point t44.

The battery management ECU 10-2 receives the measurement accepting signal from the HV ECU 40 at the time point t44. Then, once receiving the measurement accepting signal from the HV ECU 40, the battery management ECU 10-2 performs the Rp measurement at a time period from a time point t45 to a time point t50. The battery management ECU 10-2 turns ON the SW4 and the SW6 in a time period from the time point t45 to a time point t46 to charge the flying capacitor (battery charge) in the Rp measurement.

Moreover, the battery management ECU 10-2 turns ON the SW6 and the SW7 in a time period from a time point t47 to a time point t48 and then measures the voltage VRp1 by A/D sampling of the voltage of the flying capacitor. Then, the battery management ECU 10-2 turns ON the SW2 and the SW3 in a time period from a time point t49 to a time point t50 to discharge the flying capacitor.

The battery management ECU 10-2 performs the Rn measurement in a time period from a time point t51 to a time point t56. The battery management ECU 10-2 turns ON the SW1 and the SW7 in a time period from the time point t51 to a time point t52 to charge the flying capacitor (battery charge) in the Rn measurement.

Moreover, the battery management ECU 10-2 turns ON the SW6 and the SW7 in a time period from a time point t53 to a time point t54 and then measures the voltage VRn1 by A/D sampling of the voltage of the flying capacitor. Then, the battery management ECU 10-2 turns ON the SW2 and the SW3 in a time period from a time point t55 to the time point t56 to discharge the flying capacitor.

In the second embodiment, the voltage Voff can be measured at an appropriate measurement timing based on a charged state of the high voltage-side smoothing capacitor 23b (or the low voltage-side smoothing capacitor 23a and the high voltage-side smoothing capacitor 23b) when the ignition of the vehicle is OFF.

Third Embodiment

In the first embodiment, once receiving the measurement accepting signal from the HV ECU 40, the battery management ECU 10 measures the voltage Von. However, the battery management ECU 10 may measure the voltage Von without receiving the measurement accepting signal from the HV ECU 40. Then, the battery management ECU may send a weld determination result to the HV ECU 40, and then the HV ECU 40 may determine whether or not to trust and adopt the weld determination result. This will be described below as a third embodiment.

A vehicle-mounted system 1-3 of the third embodiment includes a battery management ECU 10-3 (refer to FIG. 1). The battery management ECU 10-3 includes a controller 14-3 (refer to FIG. 1). The controller 14-3 includes a measuring part 14c-3 (refer to FIG. 1). Moreover, the vehicle-mounted system 1-3 includes an HV ECU 40-3. Other elements of a configuration of the vehicle-mounted system 1-3 are the same as the configuration of the first embodiment.

In a Rp measurement while SMRs 3a and 3b are controlled to be ON, after standing by for a predetermined time period, the measuring part 14c-3 obtains a time stamp T1 and then charges a flying capacitor for a predetermined time period, and then detects a voltage VRp2 of the charged flying capacitor. The time stamp T is data showing time, for example, time at which the time stamp T has been obtained. However, in a case where the HV ECU understands completion of precharge and discharge, the measuring part 14c may not have to obtain the time stamp T1. Then, the measuring part 14c-3 charges the flying capacitor for the predetermined time period in the Rn measurement while the SMRs 3a and 3b are controlled to be ON. Then, the measuring part 14c-3 detects a voltage VRn2 of the charge flying capacitor, and then, the controller 14-3 sends a weld determination result to the HV ECU 40-3 along with the time stamp T1 obtained earlier.

(Weld Detection Process of the Third Embodiment)

Figure 8:
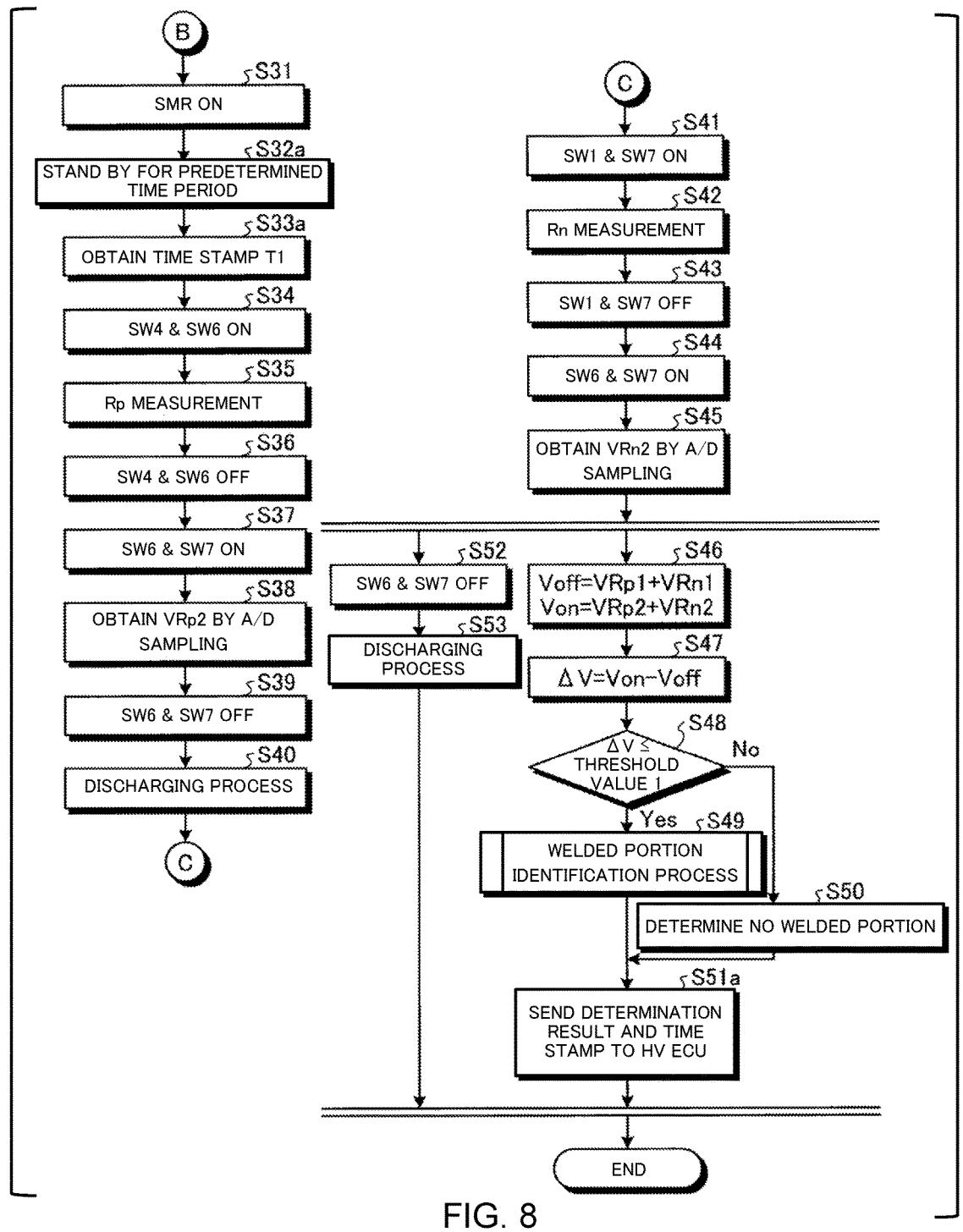
FIG. 8 is a flowchart showing an example of a weld detection process of a third embodiment

FIG. 8 is a flowchart showing an example of a weld detection process of the third embodiment. The weld detection process of the third embodiment shown in FIG. 8 is different from the weld detection process of the first embodiment in executing steps S32a to S33a instead of the steps S32 to S33 of the weld detection process of the first embodiment shown in FIG. 3B. Moreover, the weld detection process of the third embodiment shown in FIG. 8 is different from the weld detection process of the first embodiment in executing a step S51a instead of the step S51 of the weld detection process of the first embodiment in FIG. 3B.

In FIG. 8, the measuring part 14c-3 stands by for a predetermined time period after a step S31 (the step S32a). Next, the measuring part 14c-3 obtains the time stamp T1 (the step S33a). Once the step S33a ends, the measuring part 14c-3 moves the process to a step S34.

Moreover, in FIG. 8, after a step S49 or a step S50, the controller 14-3 sends, to the HV ECU 40, the time stamp T1 obtained in the step S33a, along with a determination result made in the step S49 or the step S50 (the step S51a). Once the step S51a or the step S53 ends, the controller 14-3 ends the weld detection process.

(Weld Detection Result Adoption/Scrapping Process by the HV ECU of the Third Embodiment)

Figure 9:
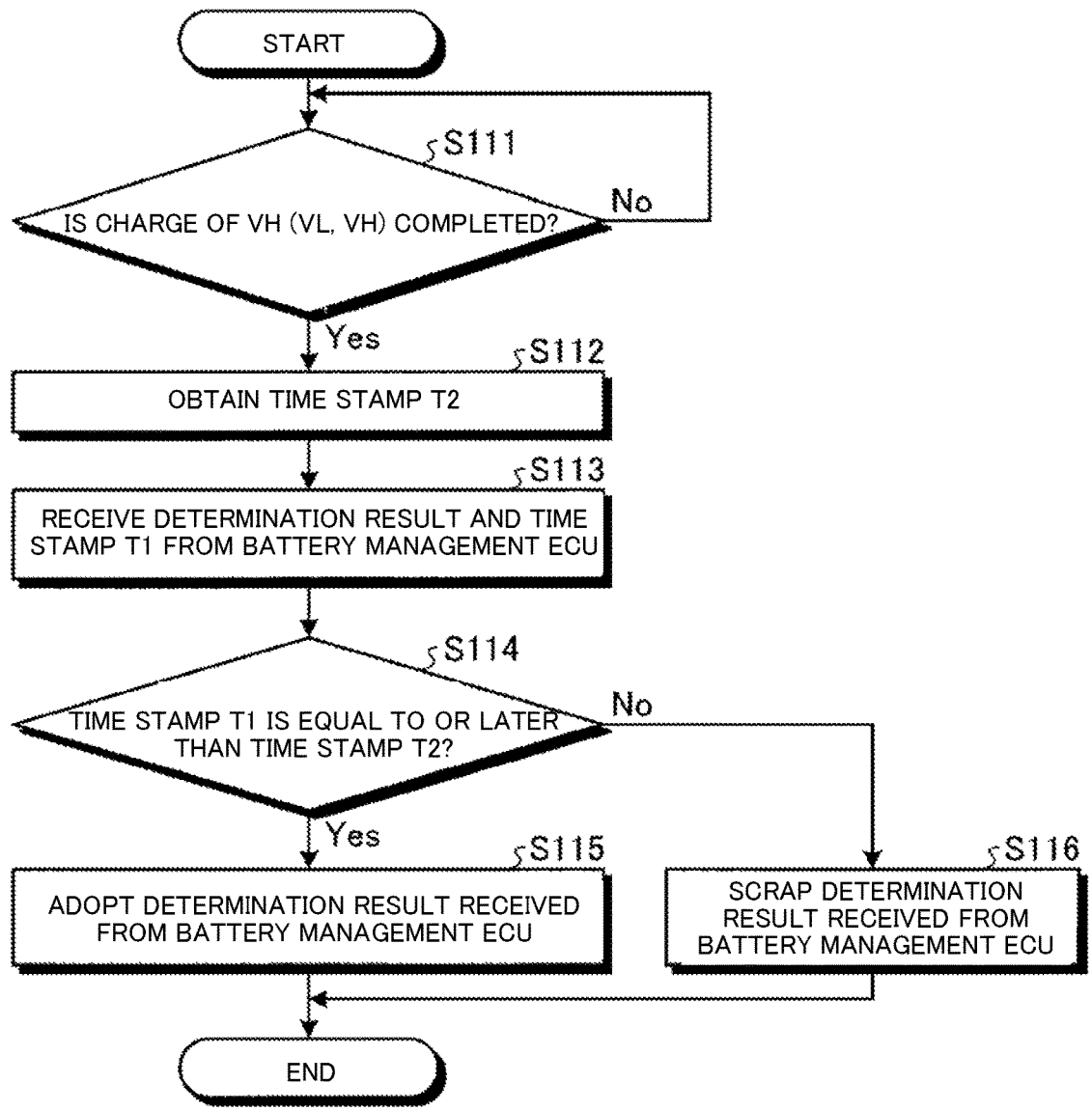
FIG. 9 is a flowchart showing an example of a weld detection result adoption/scrapping process performed by an HV ECU of the third embodiment.

FIG. 9 is a flowchart showing an example of a weld detection result adoption/scrapping process performed by the HV ECU of the third embodiment. The HV ECU 40-3 compares the time stamp T1 with a time stamp T2. The HV ECU 40-3 receives the time stamp T1 from the battery management ECU 10-3 along with the determination result. The time stamp T2 indicates a time point at which charge of the high voltage-side smoothing capacitor 23b (or the low voltage-side smoothing capacitor 23a and the high voltage-side smoothing capacitor 23b) has been determined to be completed. Then, in a case where the time stamp T1 shows a time point equal to or later than the time stamp 12, the HV ECU 40-3 regards the determination result as being reliable and adopts the result. The case where the time stamp T1 shows the time point equal to or later than the time stamp T2 is a case in which the received determination result has been determined based on a voltage Von measured after charge of the high voltage-side smoothing capacitor 23b (or the low voltage-side smoothing capacitor 23a and the high voltage-side smoothing capacitor 23b) is completed. On the other hand, in a case where the time stamp T1 shows a time point earlier than the time stamp T2, the HV ECU 40-3 scraps the determination result as being unreliable. The case where the time stamp T1 show the time point earlier than the time stamp T2 is a case in which the received determination result is determined based on the voltage Von measured before the charge of the high voltage-side smoothing capacitor 23b (or the low voltage-side smoothing capacitor 23a and the high voltage-side smoothing capacitor 23b) is completed.

As shown in FIG. 9, the HV ECU 40-3 first controls the SMRs 3a and 3b to be turned ON, and then determines whether or not the charge of the high voltage-side smoothing capacitor 23b (or the low voltage-side smoothing capacitor 23a and the high voltage-side smoothing capacitor 23b) is completed (a step S111). In a case where the charge of the high voltage-side smoothing capacitor 23b (or the low voltage-side smoothing capacitor 23a and the high voltage-side smoothing capacitor 23b) is completed after the HV ECU 40-3 controls the SMRs 3a and 3b to be turned ON (Yes in the step S111), the HV ECU 40-3 moves the process to a step S112. On the other hand, in a case where the charge of the high voltage-side smoothing capacitor 23b (or the low voltage-side smoothing capacitor 23a and the high voltage-side smoothing capacitor 23b) is not completed after the SMRs 3a and 3b are controlled to be turned ON (No in the step S111), the HV ECU 40-3 repeats the step S111.

In the step S112, the HV ECU 40-3 obtains the time stamp 12 indicative of a current time of the system. Next, the HV ECU 40-3 receives the determination result and the time stamp T1 from the battery management ECU 10-3 (a step S113). Next, the HV ECU 40-3 determines whether or not the time stamp T1 is equal to or later than the time stamp T2 (a step S114). In the case where the time stamp T1 is equal to or later than the time stamp T2 (Yes in the step S114), the HV ECU 40-3 moves the process to a step S115. On the other hand, in the case where the time stamp T1 is earlier than the time stamp T2 (No in the step S114), the HV ECU 40-3 moves the process to a step S116.

In the step S115, the HV ECU 40-3 determines to adopt the determination result received from the battery management ECU 10-3. On the other hand, in the step S116, the HV ECU 40-3 determines to scrap (ignore) the determination result received from the battery management ECU 10-3. Once the step S115 or the step S116 ends, the HV ECU 40-3 ends the weld detection result adoption/scrapping process.

In the third embodiment, the battery management ECU 10-3 performs the weld detection process independently of the HV ECU 40-3. By adopting/scrapping the determination result from the weld detection process, the third embodiment produces a same effect as the effect produced by the first embodiment or the second embodiment although the configuration and the process of the HV ECU 40-3 of the third embodiment is different from the first and second embodiments.

Fourth Embodiment

In the first embodiment, the HV ECU 40 monitors the charged state of the high voltage-side smoothing capacitor 23b (or the low voltage-side smoothing capacitor 23a and the high voltage-side smoothing capacitor 23b) via the PCU 20. However, the battery management ECU may monitor the charged state of the high voltage-side smoothing capacitor 23b (or the low voltage-side smoothing capacitor 23a and the high voltage-side smoothing capacitor 23b). This case will be described below as a fourth embodiment.

A vehicle-mounted system 1-4 of the fourth embodiment includes a battery management ECU 10-4 (refer to FIG. 1). The battery management ECU 10-4 includes a controller 14-4 (refer to FIG. 1). The controller 14-4 includes a measuring part 14c-4 (refer to FIG. 1). Moreover, the vehicle-mounted system 1-4 includes an HV ECU 40-4. Other elements of a configuration of the vehicle-mounted system 1-4 are the same as the configuration of the first embodiment.

(Weld Detection Process of the Fourth Embodiment)

Figure 10:
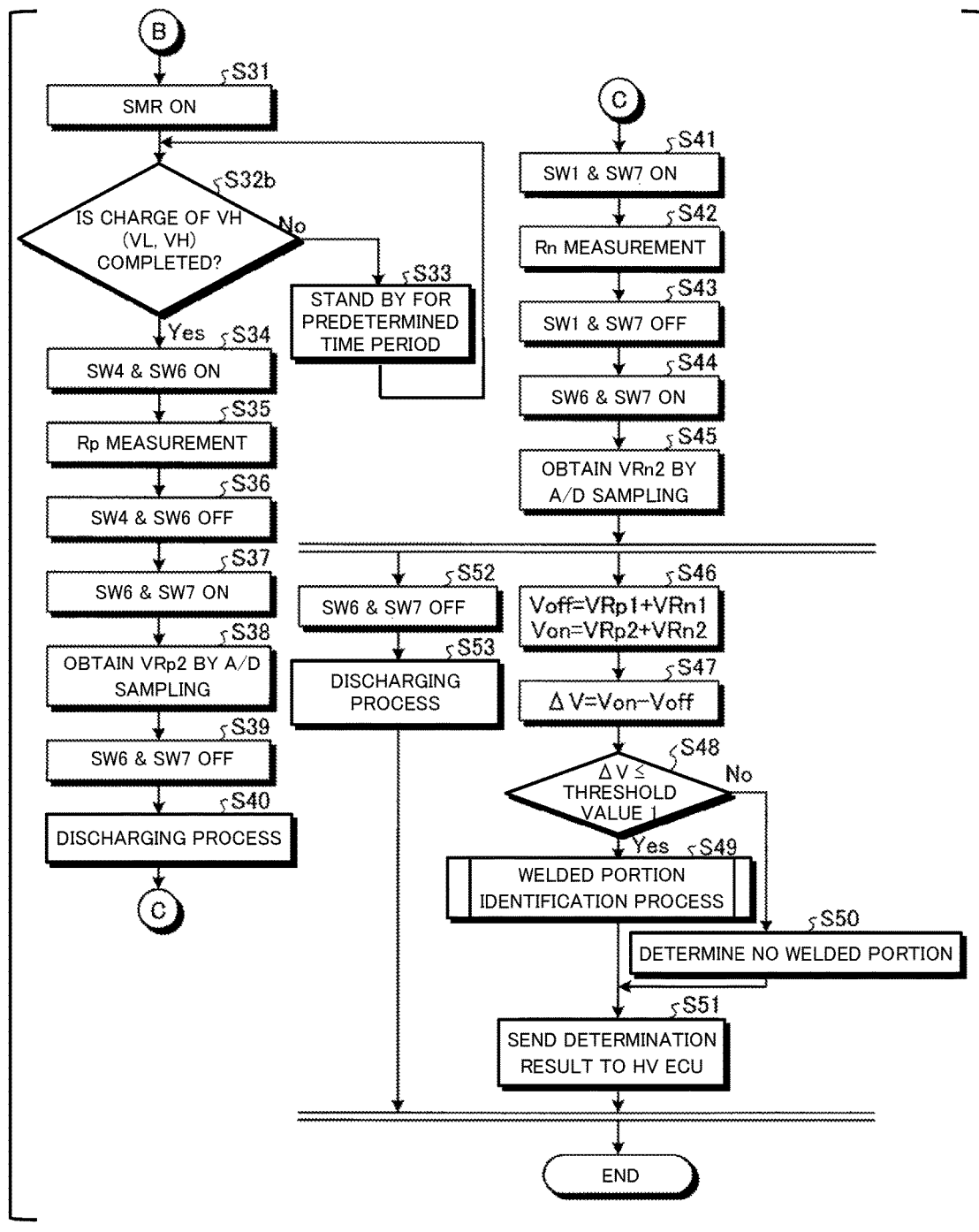
FIG. 10 is a flowchart showing an example of a weld detection process of a fourth embodiment.

FIG. 10 is a flowchart showing an example of a weld detection process of the fourth embodiment. The weld detection process of the fourth embodiment shown in FIG. 10 is different from the weld detection process of the first embodiment in executing a step S32b instead of the step S32 of the weld detection process of the first embodiment shown in FIG. 3B.

In FIG. 10, the measuring part 14c-4 controls SMRs 3a and 3b to be turned ON after a step S31, and then determines whether or not charge of the high voltage-side smoothing capacitor 23b (or the low voltage-side smoothing capacitor 23a and the high voltage-side smoothing capacitor 23b) is completed (the step S32b). In a case where the charge of the high voltage-side smoothing capacitor 23b (or the low voltage-side smoothing capacitor 23a and the high voltage-side smoothing capacitor 23b) is completed after the measuring part 14c-4 controls the SMRs 3a and 3b to be turned ON (Yes in the step S32b), the measuring part 14c-4 moves the process to a step S34. On the other hand, in a case where the charge of the high voltage-side smoothing capacitor 23b (or the low voltage-side smoothing capacitor 23a and the high voltage-side smoothing capacitor 23b) is not completed after the SMRs 3a and 3b are controlled to be turned ON (No in the step S32b), the measuring part 14c-4 moves the process to a step S33.

The battery management ECU 10-4 of the fourth embodiment produces a same effect as the effect produced by the first embodiment, the second embodiment or the third embodiment although the battery management ECU 10-4 of the fourth embodiment has the configuration to monitor a charged state of the high voltage-side smoothing capacitor 23b (or the low voltage-side smoothing capacitor 23a and the high voltage-side smoothing capacitor 23b) and performs the monitoring process.

Functional allocation for the processes described in the foregoing embodiments is only an example and it is possible to change the allocation without departing from the scope of the disclosed technology. Moreover, all or some of steps described to be automatically performed may be performed manually, or all or some of steps described to be manually performed may be performed automatically using a well-known method. Information including the process procedures, the control procedures, concrete names, data and various parameters in the foregoing embodiments and in the drawings may be changed arbitrarily if not otherwise specified.

It is possible for a person skilled in the art easily to conceive of additional effects and modifications. Therefore, a broader aspect of the disclosed technology is not limited to the specific details, the embodiment and the modifications cited and described above. Thus, this invention can be variously modified without departing from the spirit or the scope of the comprehensive concept of the invention defined by the attached claims and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. A weld detection apparatus that is mounted on a vehicle, the weld detection apparatus comprising a microcomputer configured to:
    measure a first voltage of a first capacitor and measure a second voltage of the first capacitor, the first voltage being measured when the first capacitor is charged while connected in series to a power supply and a ground of a vehicle body of the vehicle while switches that connect the power supply to a load circuit are controlled to be in a first state, the second voltage being measured at a predetermined timing, when the first capacitor is charged while connected in series to the power supply and the ground of the vehicle body of the vehicle while the switches are controlled to be in a second state different from the first state; and
    perform a weld detection process to decide which of the switches is welded in an ON-state in a case where a difference between the first voltage and the second voltage is equal to or smaller than a predetermined threshold value, and determine that none of the switches is welded in the ON-state in a case where the difference between the first voltage and the second voltage is greater than the predetermined threshold value.

2. The weld detection apparatus according to claim 1, wherein
    a second capacitor is included in the load circuit, and
    the predetermined timing is a time point at which a measurement accepting signal is sent from an external apparatus that monitors a voltage of the second capacitor, once the voltage of the second capacitor satisfies a predetermined condition, the external apparatus being external to the microcomputer and external to the load circuit.

3. The weld detection apparatus according to claim 1, wherein
    a second capacitor is included in the load circuit, and
    the microcomputer is further configured to send a result of a determination made by the microcomputer to an external apparatus (i) that adopts the result of the determination in a case where a voltage of the second capacitor satisfies a predetermined condition at the predetermined timing and (ii) that scraps the result of the determination in a case where the voltage of the second capacitor does not satisfy the predetermined condition at the predetermined timing, while monitoring the voltage of the second capacitor, the external apparatus being external to the microcomputer and external to the load circuit.

4. The weld detection apparatus according to claim 1, wherein
    a second capacitor is included in the load circuit,
    the microcomputer monitors a voltage of the second capacitor, and;
    the predetermined timing is a time point at which the microcomputer detects that the voltage of the second capacitor has satisfied a predetermined condition.

5. The weld detection apparatus according to claim 1, wherein
    the first state is a state in which the switches are controlled to be OFF after an ignition of the vehicle has been turned ON, and
    the second state is a state in which the switches are controlled to be ON after the ignition of the vehicle has been turned ON.

6. The weld detection apparatus according to claim 1, wherein
    the first state is a state in which the switches are controlled to be ON after an ignition of the vehicle has been turned OFF, and
    the second state is a state in which the switches are controlled to be OFF after the ignition of the vehicle has been turned OFF.

7. The weld detection apparatus according to claim 1, wherein
    the switches include a first switch and a second switch, the first switch connecting a positive electrode side of the power supply to the load circuit, and the second switch connecting a negative electrode side of the power supply to the load circuit,
    the second voltage is a sum voltage of a third voltage and a fourth voltage of the first capacitor obtained while both of the first switch and the second switch are controlled to be in the second state, the third voltage being measured when the first capacitor is charged while being connected in series to the positive electrode side of the power supply and the ground of the vehicle body, and the fourth voltage being measured when the first capacitor is charged while being connected in series to the negative electrode side of the power supply and the ground of the vehicle body,
    when the difference between the first voltage and the second voltage becomes equal to or smaller than the predetermined threshold, (a) the microcomputer determines that the first switch is welded in the ON-state in a case where the third voltage is equal to or greater than the fourth voltage, and (b) the microcomputer determines that the second switch is welded in the ON-state in a case where the third voltage is smaller than the fourth voltage.

8. A weld detection method that is executed by a microcomputer of a weld detection apparatus that is mounted on a vehicle, the weld detection method comprising the steps of:
    (a) measuring a first voltage of a first capacitor and measuring a second voltage of the first capacitor, the first voltage being measured when the first capacitor is charged while being connected in series to a power supply and a ground of a vehicle body of the vehicle while switches that connect the power supply to a load circuit are controlled to be in a first state, the second voltage being measured at a predetermined timing, when the first capacitor is charged while being connected in series to the power supply and the ground of the vehicle body of the vehicle while the switches are controlled to be in a second state different from the first state; and (b) performing a weld detection process to decide which of the switches is welded in an ON-state in a case where a difference between the first voltage and the second voltage is equal to or smaller than a predetermined threshold value, and determining that none of the switches is welded in the ON-state in a case where the difference between the first voltage and the second voltage is greater than the predetermined threshold value.

* * * * *